(12) United States Patent
Miyashita et al.

(10) Patent No.: US 9,053,910 B2
(45) Date of Patent: Jun. 9, 2015

(54) MAGNETRON SPUTTERING TARGET AND PROCESS FOR PRODUCING THE SAME

(75) Inventors: Takanobu Miyashita, Tsukuba (JP); Yasuyuki Goto, Tsukuba (JP)

(73) Assignee: TANAKA KIKINZOKU KOGYO K.K., Tokyo (JP)

( * ) Notice: Subject to any disclaimer, the term of this patent is extended or adjusted under 35 U.S.C. 154(b) by 0 days.

(21) Appl. No.: 13/813,737

(22) PCT Filed: Jul. 29, 2011

(86) PCT No.: PCT/JP2011/067475
§ 371 (c)(1),
(2), (4) Date: Mar. 21, 2013

(87) PCT Pub. No.: WO2012/017952
PCT Pub. Date: Feb. 9, 2012

(65) Prior Publication Data
US 2013/0175166 A1     Jul. 11, 2013

(30) Foreign Application Priority Data

Aug. 6, 2010  (JP) .................................. 2010-178199

(51) Int. Cl.
*H01J 37/34*    (2006.01)
*C23C 14/34*    (2006.01)
(Continued)

(52) U.S. Cl.
CPC ............... *H01J 37/3426* (2013.01); *B22F 3/12* (2013.01); *C22C 19/05* (2013.01); *C22C 38/30* (2013.01); *C22C 1/0433* (2013.01); *C22C 19/07* (2013.01);
(Continued)

(58) Field of Classification Search
CPC .. H01J 37/3426; H01J 37/3429; C22C 19/07; C22C 32/0026; C22C 19/05; C22C 38/30; C22C 1/0433; C23C 14/3414; C23C 14/3407
USPC ......................................... 204/298.12, 298.13
See application file for complete search history.

(56) References Cited

U.S. PATENT DOCUMENTS

| | | | |
|---|---|---|---|
| 8,568,576 B2 * | 10/2013 | Sato | ......................... 204/298.13 |
| 2010/0320084 A1 | 12/2010 | Sato | |
| 2013/0001079 A1 | 1/2013 | Sato | |
| 2013/0015061 A1 | 1/2013 | Sato | |

FOREIGN PATENT DOCUMENTS

| | | |
|---|---|---|
| JP | A-2008-163438 | 7/2008 |
| JP | A-2009-132975 | 6/2009 |

(Continued)

OTHER PUBLICATIONS

'Disperse' definition. Merriam-Webster ONline Dictionary [http://www.merriam-webster.com/dictionary/disperse] [Accessed on Jun. 10, 2014].*

(Continued)

*Primary Examiner* — Michael Band
(74) *Attorney, Agent, or Firm* — Oliff PLC

(57) ABSTRACT

A magnetron sputtering target containing a ferromagnetic metal element includes a magnetic phase containing the ferromagnetic metal element; a plurality of non-magnetic phases containing the ferromagnetic metal element, the plurality of non-magnetic phases containing a different constituent element from each other or containing constituent elements at different ratios from each other; and an oxide phase. Regions of the magnetic phase and the plurality of non-magnetic phases are separated from each other by the oxide phase.

3 Claims, 19 Drawing Sheets

(51) Int. Cl.
  *B22F 3/12* (2006.01)
  *B22F 1/02* (2006.01)
  *C22C 19/05* (2006.01)
  *C22C 19/07* (2006.01)
  *C22C 38/30* (2006.01)
  *C22C 32/00* (2006.01)
  *C22C 1/04* (2006.01)
  *G11B 5/851* (2006.01)
  *H01F 41/18* (2006.01)

(52) U.S. Cl.
  CPC ......... *C22C 32/0026* (2013.01); *C23C 14/3414* (2013.01); *G11B 5/851* (2013.01); *H01F 41/183* (2013.01); *C23C 14/3407* (2013.01); *B22F 1/02* (2013.01); *C22C 2202/02* (2013.01)

(56) References Cited

FOREIGN PATENT DOCUMENTS

| | | |
|---|---|---|
| JP | A-2009-293102 | 12/2009 |
| JP | B1-4422203 | 2/2010 |
| JP | B1-4871406 | 2/2012 |
| TW | 200944605 A | 11/2009 |

OTHER PUBLICATIONS

Jul. 26, 2011 Japanese Office Action issued in Japanese Application No. 2010-178199 (with translation).

Aug. 30, 2011 International Search Report issued in International Application No. PCT/JP2011/067475 (with translation).

Feb. 12, 2013 International Preliminary Report on Patentability issued in International Application No. PCT/JP2011/067475 (with translation).

\* cited by examiner

MAGNETRON SPUTTERING TARGET AND PROCESS FOR PRODUCING THE SAME

TECHNICAL FIELD

The present invention relates to a magnetron sputtering target containing a ferromagnetic metal element and to a process for producing the same.

BACKGROUND ART

In magnetron sputtering, magnets are disposed on the rear side of a target, and leakage magnetic flux flowing toward the front side of the target causes plasma to be concentrated at high density. This allows stable high-rate sputtering.

Therefore, the target used for magnetron sputtering is required to allow a large amount of leakage magnetic flux to flow toward the front side of the target.

For example, Patent Literature 1 discloses a magnetron sputtering target containing Co. More specifically, this magnetron sputtering target includes a magnetic phase containing Co, a non-magnetic phase containing Co, and an oxide phase, and the magnetic phase, the non-magnetic phase, and the oxide phase are dispersed in each other. The magnetic phase contains Co and Cr as main components, and the ratio of the amount of Co contained in the magnetic phase is not less than 76 at % and not more than 80 at % or lower. Patent Literature 1 discloses another magnetron sputtering target containing Co. More specifically, this magnetron sputtering target includes a magnetic phase containing Co and a non-magnetic phase containing Co, and the magnetic phase and the non-magnetic phase are dispersed in each other. The non-magnetic phase is a Pt—Co alloy phase containing Pt as a main component, and the ratio of the amount of Co contained in the Pt—Co alloy phase is more than 0 at % and not more than 13 at %.

These magnetron sputtering targets allow an increased amount of leakage magnetic flux to flow from the surfaces of the targets during magnetron sputtering without reducing the amount of Co, or a ferromagnetic metal element, contained in the targets, so that magnetron sputtering can be performed favorably.

CITATION LIST

Patent Literature

Patent Literature 1: Japanese Patent No. 4422203

SUMMARY OF INVENTION

Technical Problem

However, there is a need to further increase the amount of leakage magnetic flux during magnetron sputtering without reducing the amount of the ferromagnetic metal element contained in the target.

The present invention has been made in view of the foregoing circumstances, and it is an object to provide a magnetron sputtering target that allows an increased amount of leakage magnetic flux to flow during magnetron sputtering as compared to that in conventional targets, without reducing the amount of the ferromagnetic metal element contained in the target, as well as to provide a process for producing the magnetron sputtering target.

Solution to Problem

The above object of the present invention is achieved by providing a magnetron sputtering target containing a ferromagnetic metal element, the magnetron sputtering target including a magnetic phase containing the ferromagnetic metal element; a plurality of non-magnetic phases containing the ferromagnetic metal element, the plurality of non-magnetic phases containing a different constituent element from each other or containing constituent elements at different ratios from each other; and an oxide phase; wherein regions of the magnetic phase and the plurality of non-magnetic phases are separated from each other by the oxide phase.

Herein, the phrase "regions of the magnetic phase and the plurality of non-magnetic phases are separated from each other by the oxide phase" means a state in which the oxide phase prevents diffusion of atoms between these regions.

The "magnetic phase" is a phase with magnetism (except for phases with magnetism sufficiently lower than the magnetism of ordinary magnetic substances), and the "non-magnetic phase" is a concept including not only phases with no magnetism but also phases with magnetism sufficiently lower than the magnetism of ordinary magnetic substances.

In the present invention, the plurality of non-magnetic phases containing the ferromagnetic metal element, the plurality of non-magnetic phases containing a different constituent element from each other or containing constituent elements at different ratios from each other, are provided. This allows the volume fraction of the magnetic phase containing the ferromagnetic metal element relative to the total volume of the target to be reduced while the total amount of the ferromagnetic metal element contained in the target is held constant, so that the magnetism of the target as a whole can be reduced. Therefore, the amount of leakage magnetic flux from the surface of the target during magnetron sputtering can be increased without reducing the amount of the ferromagnetic metal element contained in the target, and magnetron sputtering can thereby be performed favorably.

The plurality of non-magnetic phases may be, for example, two non-magnetic phases.

The ferromagnetic metal element is, for example, Co. In this case, when magnetron sputtering is performed using the target, a magnetic recording medium having high magnetic recording characteristics can be easily obtained.

The magnetic phase may be, for example, a Co—Cr alloy phase containing Co and Cr as main components. In this case, the ratio of the amount of Co contained in the magnetic phase is preferably not less than 85 at %, from the viewpoint of increasing the amount of leakage magnetic flux from the surface of the target by increasing the volume fraction of the non-magnetic phases relative to the total volume of the target to reduce the volume fraction of the magnetic phase. Moreover, from the above-described point of view, the magnetic phase is more preferably a phase composed only of Co.

Preferably, at least one of the non-magnetic phases is a Co—Cr alloy phase in which the ratio of the amount of Co is more than 0 at % and not more than 75 at % or a Co—Cr—Pt alloy phase in which the ratio of the amount of Co is more than 0 at % and not more than 73 at %. Preferably, at least one of the non-magnetic phases is a Co—Pt alloy phase in which the ratio of the amount of Co is more than 0 at % and not more than 12 at %.

For example, the oxide phase may contain at least one of $SiO_2$, $TiO_2$, $Ti_2O_3$, $Ta_2O_5$, $Cr_2O_3$, $CoO$, $Co_3O_4$, $B_2O_5$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.

The target may be preferably used to form a magnetic recording layer.

For example, the magnetron sputtering target can be produced by a process for producing a magnetron sputtering target, the process including the steps of: mixing and dispersing an oxide powder and a magnetic metal powder, the magnetic metal powder containing a ferromagnetic metal element, to obtain a magnetic powder mixture; mixing and dispersing an oxide powder and each of a plurality of non-magnetic metal powders, the plurality of non-magnetic metal powders containing the ferromagnetic metal element, the plurality of non-magnetic metal powders containing a different constituent element from each other or containing constituent elements at different ratios from each other, to obtain a plurality of non-magnetic powder mixtures; and mixing and dispersing the magnetic powder mixture and the plurality of non-magnetic powder mixtures to obtain a powder mixture for pressure sintering.

For example, the magnetron sputtering target can be produced by a process for producing a magnetron sputtering target, the process including the steps of: mixing and dispersing an oxide powder and a magnetic metal powder, the magnetic metal powder containing a ferromagnetic metal element, to obtain a magnetic powder mixture; mixing and dispersing an oxide powder and each of a plurality of non-magnetic metal powders, the plurality of non-magnetic metal powders containing the ferromagnetic metal element, the plurality of non-magnetic metal powders containing a different constituent element from each other or containing constituent elements at different ratios from each other, to obtain a plurality of non-magnetic powder mixtures; and mixing and dispersing the magnetic powder mixture, the plurality of non-magnetic powder mixtures, and an oxide powder to obtain a powder mixture for pressure sintering.

Herein, the "magnetic metal powder" is a powder with magnetism (except for powders with magnetism sufficiently lower than the magnetism of ordinary magnetic substances), and the "non-magnetic powders" are a concept including not only powders with no magnetism but also powders with magnetism sufficiently lower than the magnetism of ordinary magnetic substances.

Preferably, magnetic metal particles in the magnetic powder mixture are covered with an oxide powder, and non-magnetic metal particles in the plurality of non-magnetic powder mixtures are covered with an oxide powder.

The plurality of non-magnetic metal powders may be, for example, two non-magnetic metal powders.

For example, the ferromagnetic metal element is Co. In this case, when magnetron sputtering is performed using the target produced by the above-described production processes, a magnetic recording medium having high magnetic recording characteristics can be easily obtained.

When the magnetic metal powder contains Co and Cr as main components, the ratio of the amount of Co contained in the magnetic metal powder is preferably not less than 85 at % from the viewpoint of improving the leakage magnetic flux ratio of a target to be produced. The magnetic metal powder is more preferably composed only of Co.

Preferably, at least one of the plurality of non-magnetic metal, powders is a Co—Cr alloy in which the ratio of the amount of Co is more than 0 at % and not more than 75 at % or a Co—Cr—Pt alloy in which the ratio of the amount of Co is more than 0 at % and not more than 73 at %. Preferably, at least one of the plurality of non-magnetic metal powders is a Co—Pt alloy in which the ratio of the amount of Co is more than 0 at % and not more than 12 at %.

Advantageous Effects of Invention

According to the present invention, the amount of leakage magnetic flux from the surface of the target during magnetron sputtering can be increased as compared to those from conventional targets without reducing the amount of the ferromagnetic metal element contained in the target, and magnetron sputtering can be performed favorably.

DESCRIPTION OF EMBODIMENTS

Figure 1:
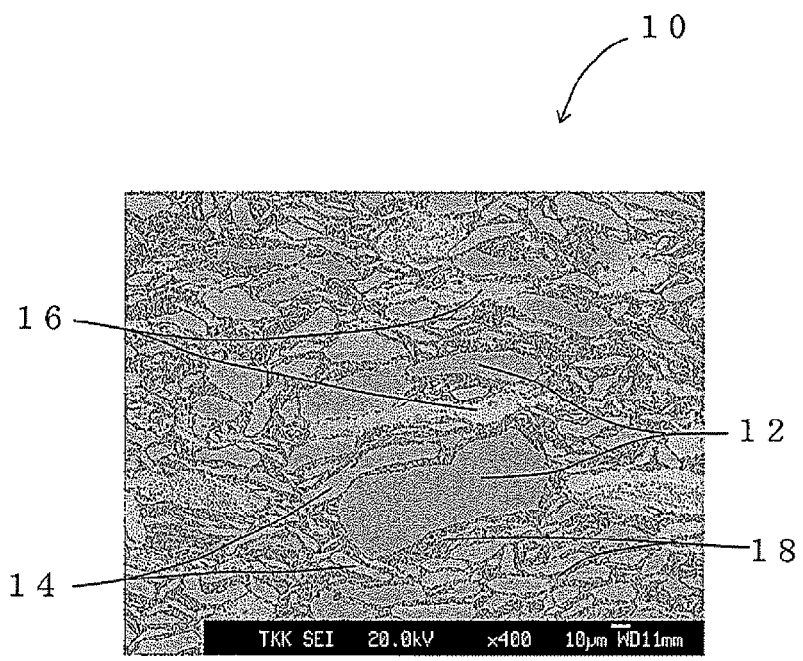
FIG. 1 is a metallurgical microscope photograph showing an example of the microstructure of a target according to an embodiment.

The magnetron sputtering target according to the present invention is a magnetron sputtering target containing a ferromagnetic metal element, the magnetron sputtering target comprising: a magnetic phase containing the ferromagnetic metal element; a plurality of non-magnetic phases containing the ferromagnetic metal element, the plurality of non-magnetic phases containing a different constituent element from each other or containing constituent elements at different ratios from each other; and an oxide phase; wherein regions of the magnetic phase and the plurality of non-magnetic phases are separated from each other by the oxide phase.

In the present invention, the plurality of non-magnetic phases containing the ferromagnetic metal element, the plurality of non-magnetic phases containing a different constituent element from each other or containing constituent elements at different ratios from each other, are provided. This allows the volume fraction of the non-magnetic phases with respect to the total volume of the target to increase while the ratio of the amounts of the constituent elements including the ferromagnetic metal element in the entire target is held constant, and the volume fraction of the magnetic phase with respect to the total volume of the target can be reduced. Therefore, the magnetism of the target as a whole can be reduced, and the amount of leakage magnetic flux from the surface of the target during magnetron sputtering can be increased, so that magnetron sputtering can be performed favorably.

For example, as described later, the magnetism of a Co—Cr alloy is substantially zero when the ratio of the amount of Co is not more than 75 at %. The magnetism of a Co—Pt alloy is substantially zero when the ratio of the amount of Co is not more than 12 at %. Therefore, when the target contains three metal elements, that is, Co, Cr, and Pt, it is more preferable to use two non-magnetic phases of a Co—Cr alloy phase containing Co in an amount of not more than 75 at % and a Co—Pt alloy phase containing Co in an amount of not more than 12 at % than one non-magnetic phase of a Co—Cr alloy phase containing Co in an amount of not more than 75 at % or a Co—Pt alloy phase containing Co in an amount of not more than 12 at %. This is because the volume fraction of the non-magnetic phases with respect to the total volume of the target can be increased while the overall composition of the target is held constant, so that the volume fraction of the magnetic phase with respect to the total volume of the target can be reduced.

As described above, when a plurality of non-magnetic phases containing a ferromagnetic metal element, the plurality of non-magnetic phases containing a different constituent element from each other or containing constituent elements at different ratios from each other, are used instead of one non-magnetic phase, the volume fraction of the non-magnetic phases with respect to the total volume of the target can be increased while the overall composition of the target is held constant, so that the volume fraction of the magnetic phase with respect to the total volume of the target can be reduced. The magnetism of the target as a whole can thereby be reduced.

When the volume fraction of the non-magnetic phases with respect to the total volume of the target is increased while the overall composition of the target is held constant, the volume fraction of the magnetic phase is reduced, and the ratio of the amount of the ferromagnetic metal element contained in the magnetic phase increases. However, as described later, when, for example, the ratio of the amount of Co contained in the Co—Cr alloy is not less than 85 at %, the magnetism of such a Co—Cr alloy is substantially the same as the magnetism of Co itself. Even when the ratio of the amount of Co is increased further, the magnetism is held substantially constant. Therefore, it is conceivable that, when the ratio of the amount of the ferromagnetic metal element contained in the magnetic phase is not less than a certain value, the magnetism of the magnetic phase does not increase significantly even when the ratio of the amount of the ferromagnetic metal element contained in the magnetic phase is increased further. For this reason, even when the ratio of the amount of the ferromagnetic metal element contained in the magnetic phase is high, the magnetism of the target as a whole can be reduced by increasing the volume fraction of the non-magnetic phases with respect to the total volume of the target to reduce the volume fraction of the magnetic phase with respect to the total volume of the target.

In the present invention, regions of the magnetic phase and the plurality of non-magnetic phases are separated from each other by the oxide phase, so that diffusion of atoms between these regions is prevented by the oxide phase. Therefore, no migration of the constituent metal atoms including the ferromagnetic metal atoms between these regions occurs during pressure sintering treatment when the target is produced. Thus, in each of the magnetic phase and the plurality of non-magnetic phases, the ratio of the amounts of the constituent metal elements including the ferromagnetic metal element is unchanged and is the same as the ratio of the amounts in the magnetic metal particles or the non-magnetic metal particles before the pressure sintering treatment. Therefore, the ratios of the amounts of the constituent metal elements contained in the respective phases can be set to the set ratios of the amounts of the constituent metal elements contained in the magnetic metal particles and the non-magnetic metal particles, and the amount of leakage magnetic flux from the surface of the target during magnetron sputtering can be increased as designed. When the ratios of the amounts of the constituent metal elements including the ferromagnetic metal element contained in the magnetic phase and the plurality of non-magnetic phases deviate from the ratios of the amounts in the magnetic metal particles and the non-magnetic metal particles before pressure sintering treatment, designed non-magnetic phases may not be obtained, and instead magnetic phases may be formed. In this case, the amount of leakage magnetic flux from the surface of the target during magnetron sputtering may not be increased as designed.

The magnetron sputtering target according to the present invention contains a ferromagnetic metal element and therefore can be used to produce magnetic recording mediums. No particular limitation is imposed on the ferromagnetic metal element that can be used in the present invention. For example, Co, Fe, and Ni can be used. When Co is used as the ferromagnetic metal element, a recording layer (magnetic layer) having a large coercive force can be formed, and a target suitable for producing hard disks can be produced.

No particular limitation is imposed on metal elements other than the ferromagnetic metal element contained in the magnetic phase and the non-magnetic phases in the magnetron sputtering target according to the present invention. For example, the magnetic phase and/or the non-magnetic phases can contain any of metal elements such as Cr, Pt, Au, Ag, Ru, Rh, Pd, Ir, W, Ta, Cu, B, and Mo.

In the following description, a Co—Cr—Pt—$SiO_2$—$TiO_2$—$Cr_2O_3$ target that can be suitably used for the production of a magnetic recording layer is used as an embodiment of the present invention and will be described specifically. In this embodiment, a three-metal phase structure including one magnetic phase and two non-magnetic phases is used. However, a multiphase structure including four or more phases including one magnetic phase and three or more non-magnetic phases may be used.

1. Constituent Components of Target

The constituent components of the target according to this embodiment are Co—Cr—Pt—$SiO_2$—$TiO_2$—$Cr_2O_3$. Co, Cr, and Pt form magnetic particles (fine magnets) in a granular structure in a magnetic recording layer formed by sputtering. The oxides ($SiO_2$, $TiO_2$, and $Cr_2O_3$) form a non-magnetic matrix that separates the magnetic particles (fine magnets) in the granular structure from each other.

The ratio of the amounts of the metals (Co, Cr, and Pt) and the ratio of the amounts of the oxides ($SiO_2$, $TiO_2$, and $Cr_2O_3$) with respect to the total amount of the target are determined according to the intended composition of the magnetic recording layer. The ratio of the amounts of the metals with respect to the total amount of the target is 88 to 94 mol %, and the ratio of the amounts of the oxides ($SiO_2$, $TiO_2$, and $Cr_2O_3$) with respect to the total amount of the target is 6 to 12 mol %.

Co is a ferromagnetic metal element and plays a central role in the formation of the magnetic particles (fine magnets) in the granular structure of the magnetic recording layer. The ratio of the amount of Co with respect to the total amount of the metals (Co, Cr, and Pt) is 60 to 80 at %.

Cr has a function of reducing the magnetic moment of Co when alloyed with Co within a prescribed composition range and plays a role in controlling the strength of the magnetism of the magnetic particles. The ratio of the amount of Cr with respect to the total amount of the metals (Co, Cr, and Pt) is 4 to 24 at %.

Pt has a function of increasing the magnetic moment of Co when alloyed with Co within a prescribed composition range and plays a role in controlling the strength of the magnetism of the magnetic particles. The ratio of the amount of Pt with respect to the total amount of the metals (Co, Cr, and Pt) is 1 to 22 at %.

In this embodiment, $SiO_2$, $TiO_2$, and $Cr_2O_3$ are used as the oxides, but the oxides used are not limited to $SiO_2$, $TiO_2$, and $Cr_2O_3$. For example, at least one oxide selected from $SiO_2$, $TiO_2$, $Ti_2O_3$, $Ta_2O_5$, $Cr_2O_3$, CoO, $CO_3O_4$, $B_2O_5$, $Fe_2O_3$, CuO, $Y_2O_3$, MgO, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$ may be used.

2. Microstructure of Target

As shown in FIG. 1 (a SEM photograph of a cross section of a target in Example 1 in a thickness direction) as an example, in the microstructure of the target according to this embodiment, the magnetic phase (a Co—Cr alloy phase containing Co in an amount of 85 at or more), a first non-magnetic phase (a Co—Cr—Pt alloy phase containing Co in an amount of larger than 0 at % and not more than 73 at %), and a second non-magnetic phase (a Co—Pt alloy phase containing Co in an amount of more than 0 at and not more than 12 at %) are dispersed from each other and separated from each other by the oxide phase so as not to come into contact with each other. In this embodiment, the magnetic phase (the Co—Cr alloy phase containing Co in an amount of 85 at % or more) may be a Co single-element phase containing 100 at % of Co, and the Co—Cr alloy phase containing Co in an amount of 85 at % or more includes a Co single-element phase containing 100 at of Co.

In FIG. 1, reference numeral 10 represents the target in this embodiment; the phase denoted by reference numeral 12 (a relatively large dark gray phase) is the magnetic phase (Co phase); the phase denoted by reference numeral 14 (a gray phase with a density between the densities of the magnetic phase 12 and the second non-magnetic phase 16) is the first non-magnetic phase (a 69Co-22Cr-9Pt alloy phase); the phase denoted by reference numeral 16 (the most whitish phase) is the second non-magnetic phase (a 5Co-95Pt alloy phase); and regions denoted by reference numeral 18 (dark gray regions separating the metal phases from each other) are the oxide phase (a $SiO_2$—$TiO_2$—$Cr_2O_3$ phase).

As described above, the three-phase structure including one magnetic phase (the Co—Cr alloy phase containing Co in an amount of 85 at % or more) and two non-magnetic phases (the Co—Cr—Pt alloy phase containing Co in an amount of more than 0 at % and not more than 73 at % and the Co—Pt alloy phase containing Co in an amount of more than 0 at % and not more than 12 at %) is used instead of a single Co—Cr—Pt alloy phase. This allows the volume fraction of the magnetic phase with respect to the total volume of the target to be reduced while the ratio of the amounts of the constituent elements including the ferromagnetic metal element contained in the entire target is held constant. With this configuration, the magnetism of the target as a whole can be reduced while the ratio of the amounts of the constituent elements contained in the target is held constant. In addition, the amount of leakage magnetic flux from the surface of the target during magnetron sputtering can be increased, and magnetron sputtering can thereby be performed favorably.

The reason why the ratio of the amount of Co contained in the Co—Cr alloy phase (magnetic phase) is set to 85 at % or more in this embodiment will be described.

Figure 2:
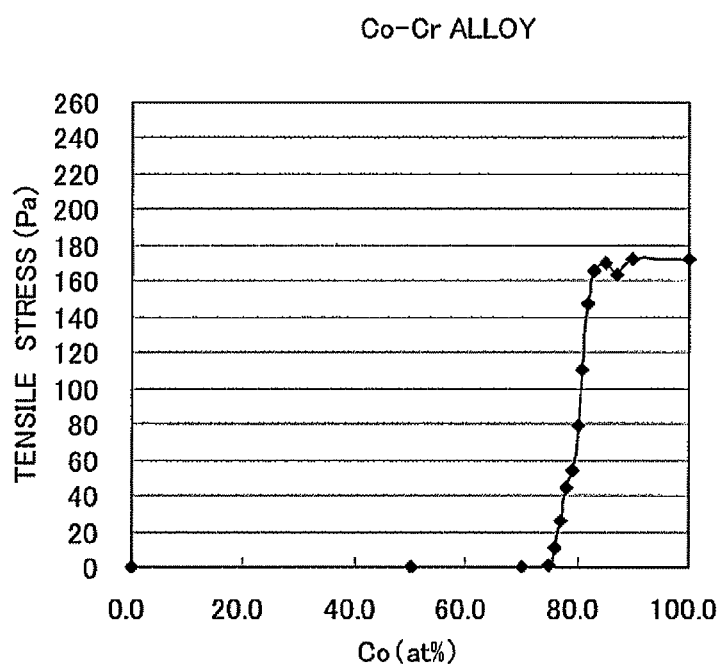
FIG. 2 is a graph showing the relationship between the ratio of the amount of Co and magnetism of a Co—Cr alloy.

TABLE 1 below shows the experimental results of the measurement of the tensile stresses of Co—Cr alloys with different ratios of amounts of Co. The tensile stress is used as a measure for evaluation of magnetism (the larger the value of the tensile stress, the larger the magnetism, as described later). FIG. 2 is a graph based on TABLE 1 below and showing the relationship between the ratio of the amount of Co in the Co—Cr alloy and its magnetism. The horizontal axis represents the ratio of the amount of Co, and the vertical axis represents the tensile stress used as the measure of evaluation of magnetism.

TABLE 1

| Ratio of amount of Co (at %) | Tensile stress (Pa) |
|---|---|
| 0 | 0.0 |
| 50 | 0.0 |
| 70 | 0.0 |
| 75 | 1.1 |

TABLE 1-continued

| Ratio of amount of Co (at %) | Tensile stress (Pa) |
|---|---|
| 76 | 11.2 |
| 77 | 26.2 |
| 78 | 44.6 |
| 79 | 54.6 |
| 80 | 79.5 |
| 81 | 110.4 |
| 82 | 147.4 |
| 83 | 165.3 |
| 85 | 169.9 |
| 87 | 164.1 |
| 90 | 172.4 |
| 100 | 172.8 |

As shown in TABLE 1 and FIG. 2, the magnetism of a Co—Cr alloy is substantially zero when the ratio of the amount of Co is not more than 75 at %. When the ratio of the amount of Co exceeds 75 at %, the magnetism increases steeply. When the ratio of the amount of Co is 83 at % or more, the gradient of the increase in magnetism decreases, and the magnetism becomes substantially constant. Therefore, in the Co—Cr alloy which is the magnetic phase, even when the ratio of the amount of Co is increased from 83 at %, almost no increase in the magnetism from that when the ratio of the amount of Co is 83 at % occurs.

Therefore, in this embodiment, the ratio of the amount of Co contained in the Co—Cr alloy phase is set to 85 at % or more. More specifically, the ratio of the amount of Co contained in the Co—Cr alloy phase which is the magnetic phase is increased with almost no increase in the magnetism from that when the ratio of the amount of Co is 83 at %. The larger the ratio of the amount of Co contained in the Co—Cr alloy phase, the smaller the volume fraction of the Co—Cr alloy phase which is the magnetic phase can be while the ratio of the amount of Co with respect to the total amount of the target is held constant, and the larger the volume fraction of the non-magnetic phases (the Co—Cr—Pt alloy phase containing Co in an amount of more than 0 at and not more than 73 at % and the Co—Pt alloy phase containing Co in an amount of more than 0 at % and not more than 12 at %) can be. The magnetism of the target as a whole can thereby be reduced.

Next, the reason why the ratio of the amount of Co contained in the Co—Cr—Pt alloy phase is set to be more than 0 at % and not more than 73 at % will be described.

As shown in TABLE 1 and FIG. 2, in the Co—Cr alloy, when the ratio of the amount of Co to the total amount of Co and Cr is 75 at % or less, the Co—Cr alloy can contain Co with the magnetism of the Co—Cr alloy being substantially zero. It is conceivable that a Co—Cr—Pt alloy prepared by adding Pt to the Co—Cr alloy shows a similar tendency. Therefore, it is conceivable that, when the ratio of the amount of Co to the total amount of Co, Cr, and Pt is 75 at % or less, the Co—Cr—Pt alloy can contain Co with the magnetism of the alloy being substantially zero. However, as described above, Pt has a function of increasing the magnetic moment of Co when alloyed with Co within a prescribed composition range. Therefore, in this embodiment, the ratio of the amount of Co to the total amount of Co, Cr, and Pt is set to 73 at % or less. In Examples described later, a large leakage magnetic flux ratio was actually obtained when the first non-magnetic phase was a 69Co-22Cr-9Pt alloy phase (the ratio of the amount of Co was 69 at %) and was not more than 73 at %). However, when the ratio of the amount of Co is zero, the Co—Cr—Pt alloy phase which is the non-magnetic phase does not contain Co, and this does not contribute to a reduction in the volume fraction of the Co—Cr alloy phase (magnetic phase) while the ratio of the amounts of the constituent elements including Co contained in the entire target 10 is held constant. Therefore, in this embodiment, the ratio of the amount of Co contained in the Co—Cr—Pt alloy phase is set to be more than 0 at % and not more than 73 at %. This allows the volume fraction of the Co—Cr alloy phase (magnetic phase) to be reduced while the ratio of the amounts of the constituent elements including Co contained in the target 10 is held constant. The magnetism of the target as a whole is thereby reduced, and magnetron sputtering can be performed favorably.

Next, the reason why the ratio of the amount of Co contained in the Co—Pt alloy phase is set to be more than 0 at % and not more than 12 at % will be described.

Figure 3:
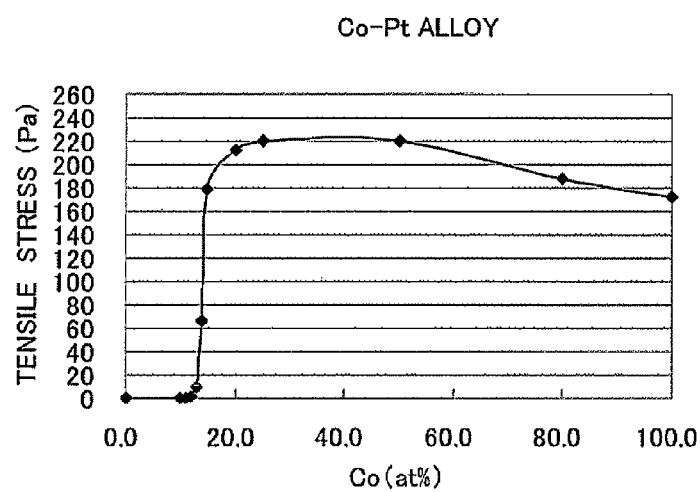
FIG. 3 is a graph showing the relationship between the ratio of the amount of Co and magnetism of a Co—Pt alloy.

TABLE 2 below shows the experimental results of the measurement of the tensile stresses of Co—Pt alloys with different amounts of Co. The tensile stress was used as a measure for evaluation of magnetism (the larger the value of the tensile stress, the larger the magnetism, as described later). FIG. 3 is a graph based on TABLE 2 below and showing the relationship between the ratio of the amount of Co contained in the Co—Pt alloy and its magnetism. The horizontal axis represents the ratio of the amount of Co, and the vertical axis represents the tensile stress used as the measure of evaluation of magnetism.

TABLE 2

| Ratio of amount of Co (at %) | Tensile stress (Pa) |
|---|---|
| 0 | 0.0 |
| 10 | 0.2 |
| 11 | 0.5 |
| 12 | 0.8 |
| 13 | 9.6 |
| 14 | 66.6 |
| 15 | 179.1 |
| 20 | 212.4 |
| 25 | 220.7 |
| 50 | 220.7 |
| 80 | 187.4 |
| 100 | 172.8 |

As shown in TABLE 2 and FIG. 3, in the Co—Pt alloy, when the ratio of the amount of Co to the total amount of Co and Pt is 12 at % or less, the Co—Pt alloy can contain Co with the magnetism of the Co—Pt alloy being substantially zero. However, when the ratio of the amount of Co is zero, there is no contribution to a reduction in the magnetism of the target as a whole by reducing the volume fraction of the Co—Cr alloy phase (magnetic phase) while the ratio of the amounts of the constituent elements including Co contained in the target 10 is held constant. Therefore, in this embodiment, the ratio of the amount of Co contained in the Co—Pt alloy phase is set to be more than 0 at % and not more than 12 at %. This allows the volume fraction of the Co—Cr alloy phase (magnetic phase) to be reduced while the ratio of the amounts of the constituent elements including Co contained in the target 10 is held constant. The magnetism of the target as a whole is thereby reduced, and magnetron sputtering can be performed preferably.

The data in TABLEs 1 and 2 and FIGS. 2 and 3 were measured by the present inventors and more specifically were measured as follows. The data in TABLE 1 and FIG. 2 was measured as follows. Co and Cr were mixed to obtain mixtures with a volume of 1 cm$^3$ and different compositions. These mixtures were arc-melted to produce disk-shaped samples having a bottom area of 0.785 cm$^2$. The bottom surface of one of the disk-shaped samples was attached to a magnet (formed of ferrite) having a residual magnetic flux density of 500 Gauss. Then the sample was pulled in a direction perpendicular to the bottom surface, and a force when the sample was detached from the magnet was measured. Since a tensile stress determined by dividing the measured force by the bottom surface area 0.785 cm$^2$ is positively correlated with the magnetism of the sample, the tensile stress was used as the measure for evaluation of magnetism, and the value of the tensile stress was shown in TABLE 1 and plotted on the vertical axis in FIG. 2. The data in TABLE 2 and FIG. 3 were obtained as in the data in TABLE 1 and FIG. 2 except that Pt and Co were mixed to obtain mixtures having a volume of 1 cm$^3$.

As described above, in the target 10 in this embodiment, the non-magnetic phases containing Co, or the Co—Cr—Pt alloy phase (containing Co in an amount of more than 0 at % and not more than 73 at %) and the Co—Pt alloy phase (containing Co in an amount of more than 0 at % and not more than 12 at %), are provided. Therefore, the volume fraction of the Co—Cr alloy phase which is the magnetic phase can be reduced while the ratio of the amounts of the constituent elements including Co contained in the target 10 can be held constant, and the magnetism of the target 10 as a whole can thereby be reduced. In the Co—Cr alloy phase which is the magnetic phase, the ratio of the amount of Co is 85 at % or more. Therefore, the ratio of the amount of Co contained in the Co—Cr alloy phase which is the magnetic phase can be increased with almost no increase in the magnetism from that when the ratio of the amount of Co is 83 at %, and the volume fraction of the Co—Cr alloy phase which is the magnetic phase can be reduced while the ratio of the amount of Co with respect to the total amount of the target is held constant. The magnetism of the target as a whole can thereby be reduced.

Therefore, in this embodiment, the amount of leakage magnetic flux from the surface of the target during magnetron sputtering can be increased while the ratio of the amount of the ferromagnetic metal element contained in the target is not reduced (the ratio of the amounts of the constituent elements contained in the target is not changed), and magnetron sputtering can thereby be performed favorably.

3. Process for Producing Target

The target 10 according to this embodiment can be produced as follows.

(1) Production of Magnetic Powder Mixture

Co and Cr are weighed such that a prescribed composition (the ratio of the amount of Co is 85 at % or more) is obtained. Then a molten alloy is produced and gas-atomized to produce an atomized Co—Cr alloy magnetic powder having the prescribed composition (the ratio of the amount of Co is 85 at % or more). In this case, Cr may not be added, and an atomized magnetic powder composed only of Co may be produced. In this embodiment, the atomized Co—Cr alloy magnetic powder having a prescribed composition (the ratio of the amount of Co is 85 at % or more) is used to include the atomized magnetic powder composed only of Co.

The produced atomized Co—Cr magnetic powder and oxide powders (SiO$_2$ powder, TiO$_2$ powder, and Cr$_2$O$_3$ powder) are mixed and dispersed to produce a magnetic powder mixture. In the oxide powders (SiO$_2$ powder, TiO$_2$ powder, and Cr$_2$O$_3$ powder), fine primary particles are aggregated to form secondary particles. The mixing and dispersing is carried out to such an extent that the atomized Co—Cr magnetic particles are densely covered with the oxide powders (SiO$_2$ powder, TiO$_2$ powder, and Cr$_2$O$_3$ powder).

Figure 4:
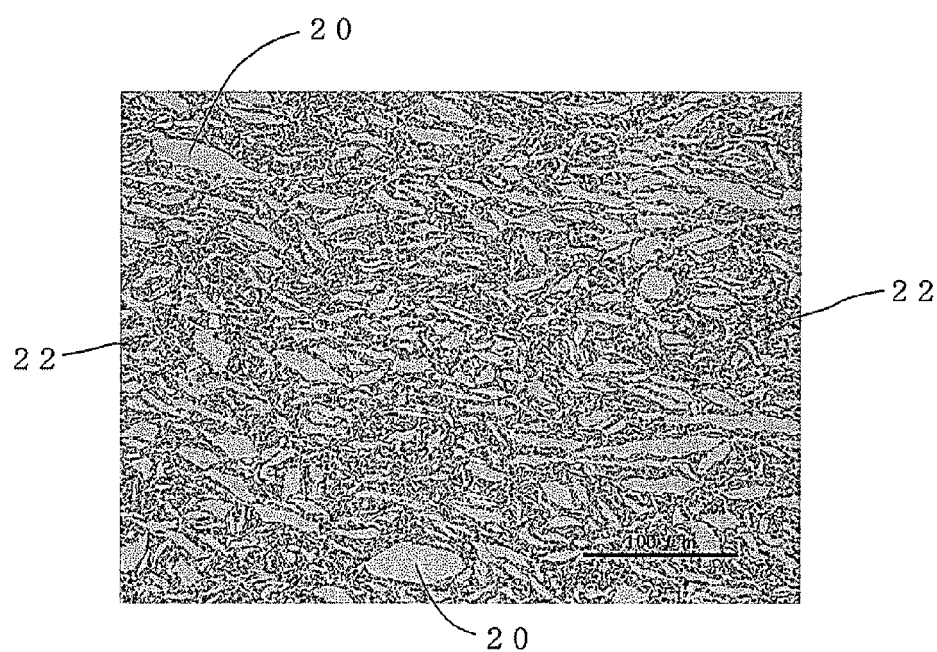
FIG. 4 is a metallurgical microscope photograph showing a cross section of a sintered body obtained by pressure sintering of a magnetic powder mixture.

FIG. 4 shows a metallurgical microscope photograph of a cross section of a sintered body prepared by pressure-sintering the magnetic powder mixture (a Co powder covered with the oxide powders) at a temperature of 1,160° C. and a pressure of 24.5 MPa for 1 h. A whitish phase denoted by reference numeral 20 is the magnetic phase (Co phase), and a dark gray portion denoted by reference numeral 22 is the oxide phase (SiO$_2$—TiO$_2$—Cr$_2$O$_3$ phase). As can be seen from FIG. 4, regions of the magnetic phase (Co phase) 20 are separated from each other by the oxide phase (SiO$_2$—TiO$_2$—Cr$_2$O$_3$ phase) 22. Therefore, the magnetic powder mixture prepared by mixing and dispersing the atomized Co—Cr alloy magnetic powder and the oxide powders (SiO$_2$ powder, TiO$_2$ powder, and Cr$_2$O$_3$ powder) is considered to be in a state in which the atomized Co—Cr alloy magnetic powder is covered with the oxide powders (SiO$_2$ powder, TiO$_2$ powder, and Cr$_2$O$_3$ powder).

(2) Production of First Non-Magnetic Powder Mixture

Co, Cr, and Pt are weighed such that a prescribed composition (the ratio of the amount of Co is more than 0 at % and not more than 73 at %) is obtained. Then a molten alloy is produced and gas-atomized to produce an atomized Co—Cr—Pt alloy non-magnetic powder having the prescribed composition (the ratio of the amount of Co is more than 0 at % and not more than 73 at %).

The produced atomized Co—Cr—Pt alloy non-magnetic powder and the oxide powders (SiO$_2$ powder, TiO$_2$ powder, and Cr$_2$O$_3$ powder) are mixed and dispersed to produce a first non-magnetic powder mixture. In the oxide powders (SiO$_2$ powder, TiO$_2$ powder, and Cr$_2$O$_3$ powder), fine primary particles are aggregated to form secondary particles. The mixing and dispersing is carried out to such an extent that the atomized Co—Cr—Pt alloy non-magnetic particles are densely covered with the oxide powders (SiO$_2$ powder, TiO$_2$ powder, and Cr$_2$O$_3$ powder).

Figure 5:
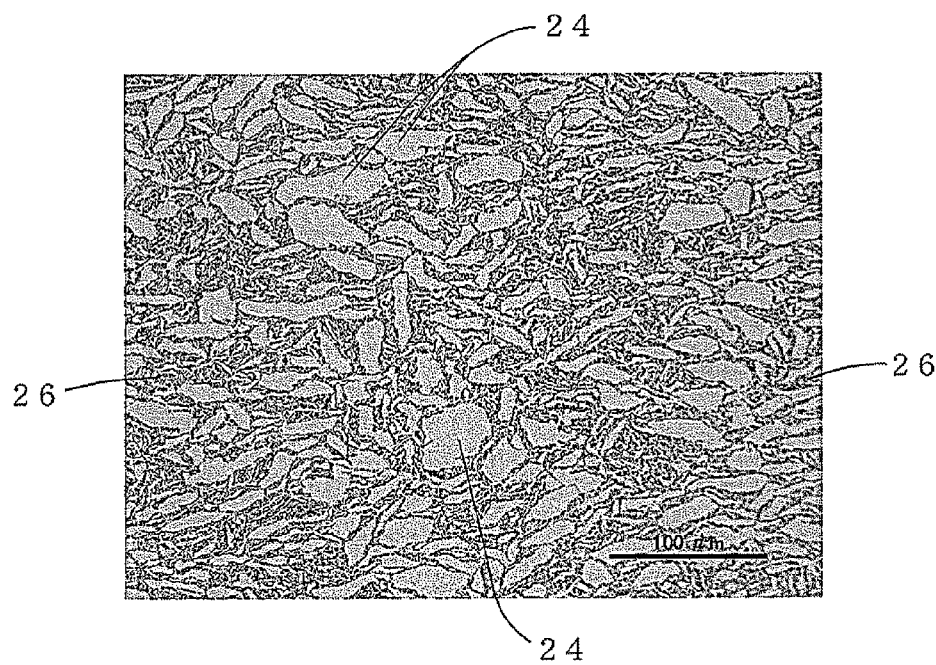
FIG. 5 is a metallurgical microscope photograph showing a cross section of a sintered body obtained by pressure sintering of a first non-magnetic powder mixture.

FIG. 5 shows a metallurgical microscope photograph of a cross section of a sintered body prepared by pressure-sintering the first non-magnetic powder mixture (the Co—Cr—Pt alloy powder covered with the oxide powders and having the prescribed composition (the ratio of the amount of Co is more than 0 at % and not more than 73 at %)). A whitish phase denoted by reference numeral 24 is the non-magnetic phase (69Co-22Cr-9Pt alloy phase), and a dark gray portion denoted by reference numeral 26 is the oxide phase (SiO$_2$—TiO$_2$—Cr$_2$O$_3$ phase). As can be seen from FIG. 5, regions of the non-magnetic phase (69Co-22Cr-9Pt alloy phase) containing Co are covered with the oxide phase (SiO$_2$—TiO$_2$—Cr$_2$O$_3$ phase). Therefore, the first non-magnetic powder mixture prepared by mixing and dispersing the atomized Co—Cr—Pt alloy non-magnetic powder and the oxide powders (SiO$_2$ powder, TiO$_2$ powder, and Cr$_2$O$_3$ powder) is considered to be in a state in which the atomized Co—Cr—Pt alloy non-magnetic powder is covered with the oxide powders (SiO$_2$ powder, TiO$_2$ powder, and Cr$_2$O$_3$ powder).

(3) Production of Second Non-Magnetic Powder Mixture

Co and Pt are weighed such that a prescribed composition (the ratio of the amount of Co is more than 0 at and not more than 12 at %) is obtained. Then a molten alloy is produced and gas-atomized to produce an atomized Co—Pt alloy non-magnetic powder having the prescribed composition (the ratio of the amount of Co is more than 0 at % and not more than 12 at %).

The produced atomized Co—Pt alloy non-magnetic powder and the oxide powders (SiO$_2$ powder, TiO$_2$ powder, and Cr$_2$O$_3$ powder) are mixed and dispersed to produce a second non-magnetic powder mixture. In the oxide powders (SiO$_2$ powder, TiO$_2$ powder, and Cr$_2$O$_3$ powder), fine primary particles are aggregated to form secondary particles. The mixing and dispersing is carried out to such an extent that the atomized Co—Pt alloy non-magnetic particles are densely covered with the oxide powders (SiO$_2$ powder, TiO$_2$ powder, and Cr$_2$O$_3$ powder).

Figure 6:
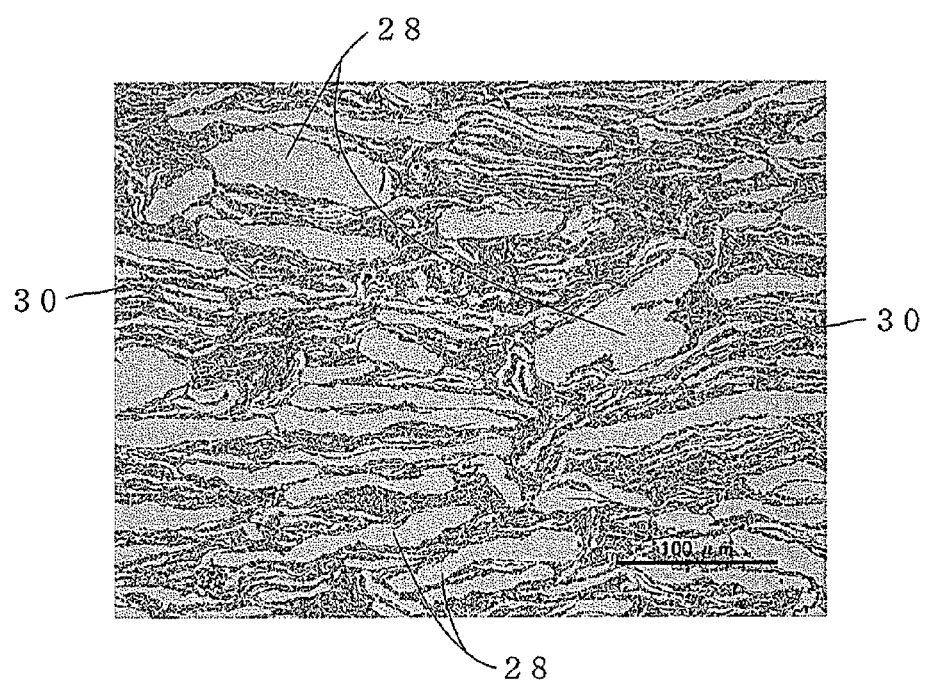
FIG. 6 is a metallurgical microscope photograph showing a cross section of a sintered body obtained by pressure sintering of a second non-magnetic powder mixture.
Figure 7:
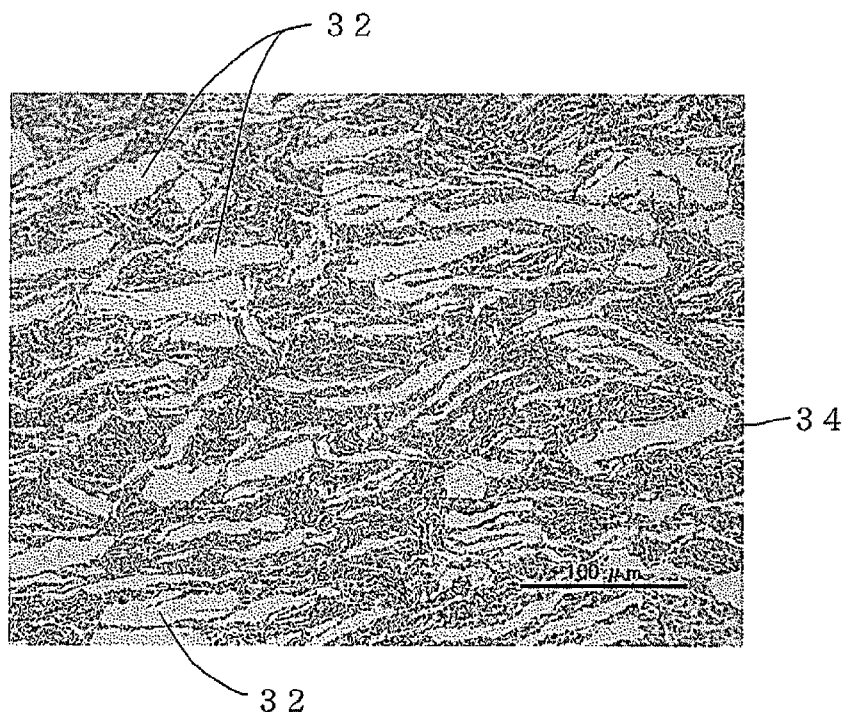
FIG. 7 is a metallurgical microscope photograph showing a cross section of a sintered body obtained by pressure sintering of a second non-magnetic powder mixture.

FIGS. 6 and 7 are metallurgical microscope photographs of cross sections of sintered bodies prepared by pressure-sintering second non-magnetic powder mixtures (Co—Pt powders covered with the oxide powders and having prescribed compositions (the ratio of the amount of Co is more than 0 at % and not more than 12 at %). In FIG. 6, the non-magnetic phase is a 5Co-95Pt alloy phase. In FIG. 7, the non-magnetic phase is a 10Co-90Pt alloy phase. In FIG. 6, reference numeral 28 represents the non-magnetic phase (5Co-95Pt alloy phase), and dark gray portions denoted by reference numeral 30 are the oxide phase (SiO$_2$—TiO$_2$—Cr$_2$O$_3$ phase). In FIG. 7, reference numeral 32 represents the non-magnetic phase (10Co-90Pt alloy phase), and dark gray portions denoted by reference numeral 34 are the oxide phase (SiO$_2$—TiO$_2$—Cr$_2$O$_3$ phase). In both FIGS. 6 and 7, regions of the non-magnetic phase are covered with the oxide phase (SiO$_2$—TiO$_2$—Cr$_2$O$_3$ phase). Therefore, the second non-magnetic powder mixture produced by mixing and dispersing an atomized Co—Pt alloy non-magnetic powder and the oxide powders (SiO$_2$ powder, TiO$_2$ powder, and Cr$_2$O$_3$ powder) is considered to be in a state in which the atomized Co—Pt alloy non-magnetic powder is covered with the oxide powders (SiO$_2$ powder, TiO$_2$ powder, and Cr$_2$O$_3$ powder).

(4) Production of Powder Mixture for Pressure Sintering

The produced magnetic powder mixture (the Co—Cr alloy powder covered with the oxide powders), the first non-magnetic powder mixture (the Co—Cr—Pt alloy powder covered with the oxide powders), and the second non-magnetic powder mixture (the Co—Pt alloy powder covered with the oxide powders) are mixed and dispersed substantially uniformly to produce a powder mixture for pressure sintering. When the powder mixture for pressure sintering is produced, an oxide powder may be optionally added to the magnetic powder mixture, the first non-magnetic powder mixture, and the second non-magnetic powder mixture, and these powders may be mixed and dispersed. The mixing and dispersing in this step is terminated before the diameters of the particles become small. If the mixing and dispersing is carried out to such an extent that the particle diameters become small, the oxide powder layers covering the atomized metal powder are destroyed. In such a case, the three atomized metal powders (Co—Cr alloy powder, Co—Cr—Pt alloy powder, and Co—Pt alloy powder) come into contact with each other. This allows diffusion of the metal atoms during mixing and dispersing, and the compositions of the atomized metal powders may deviate from the prescribed compositions.

(5) Molding

The produced powder mixture for pressure sintering is pressure-sintered and molded using, for example, a vacuum hot press method to produce a target.

(6) Feature of Production Process

The feature of the production process in this embodiment is as follows. The metal powders (Co—Cr alloy powder, Co—Cr—Pt alloy powder, and Co—Pt alloy powder) are separately mixed with and dispersed in the oxide powders (SiO$_2$ powder, TiO$_2$ powder, and Cr$_2$O$_3$ powder) to cover the metal particles with the oxide powders, and powder mixtures are thereby formed (a first mixing step). Then the powder mixtures are mixed with and dispersed in each other to obtain a powder mixture for pressure sintering (a second mixing step). The powder mixture for pressure sintering is produced through two mixing steps.

In the first mixing step, the mixing is continued until the metal particles (Co—Cr alloy particles, Co—Cr—Pt alloy particles, and Co—Pt alloy particles) are densely covered with the oxide powders (SiO$_2$ powder, TiO$_2$ powder, and Cr$_2$O$_3$ powder) (during mixing, the particle diameters of the oxide powders become smaller). However, in the second mixing step, the mixing and dispersing is terminated before the diameters of the particles become small.

In the first mixing step, the mixing is continued until the metal particles (Co—Cr alloy particles, Co—Cr—Pt alloy particles, and Co—Pt alloy particles) are densely covered with the oxide powders (SiO$_2$ powder, TiO$_2$ powder, and Cr$_2$O$_3$ powder). This allows the oxide powders to be sufficiently fine-grained and to densely cover the metal particles. Therefore, the metal particles can be effectively prevented from coming into contact with each other.

In the second mixing step, the mixing and dispersing is terminated before the diameters of the particles become small. Therefore, the oxide powder layers covering the atomized metal powders are not destroyed, so that the three atomized metal powders (Co—Cr alloy powder, Co—Cr—Pt alloy powder, and Co—Pt alloy powder) are prevented from coming into contact with each other. This can prevent the compositions of the atomized metal powders from deviating from the prescribed compositions due to diffusion of the metal atoms during mixing and dispersing.

Since the surfaces of the atomized metal powders have been covered with the oxide powders, the diffusion and migration of the metal atoms between the atomized metal powders are less likely to occur even during vacuum hot press. Therefore, changes in the ratios of the amounts of the constituent elements in the metal phases (Co—Cr alloy phase, Co—Cr—Pt alloy phase, and Co—Pt alloy phase) during pressure sintering can be prevented. In this manner, phases designed to form non-magnetic phases in a target to be obtained can be prevented from being magnetized. The volume fraction of the non-magnetic phases with respect to the total volume of the target can thereby be maintained high as designed, and the amount of leakage magnetic flux from the surface of the target during magnetron sputtering can be reliably increased.

EXAMPLES

Example 1

The overall composition of a target produced in Example 1 was 91 (73Co-11Cr-16Pt)-4SiO$_2$-2TiO$_2$-3Cr$_2$O$_3$, and the target was produced and evaluated as follows. The ratio of the amount of Co with respect to the total amount of the metals (Co, Cr, and Pt) in the target was 73 at %, the ratio of the amount of Cr was 11 at %, and the ratio of the amount of Pt was 16 at %.

Co alone was heated to 1,700° C. to obtain molten Co, and the molten Co was gas-atomized to produce a Co powder (magnetic metal powder).

Co, Cr, and Pt were weighed such that an alloy to be produced had an alloy composition of Co: 69 at %, Cr: 22 at %, and Pt: 9 at % and were heated to 1,700° C. to form a molten 69Co-22Cr-9Pt alloy. The molten alloy was gas-atomized to produce a 69Co-22Cr-9Pt alloy powder (first non-magnetic metal powder).

Co and Pt were weighed such that an alloy to be produced had an alloy composition of Co: 5 at % and Pt: 95 at and were heated to 2,000° C. to form a molten 5Co-95Pt alloy. The molten alloy was gas-atomized to produce a 5Co-95Pt alloy powder (second non-magnetic metal powder).

The produced three atomized metal powders (Co powder, 69Co-22Cr-9Pt alloy powder, and 5Co-95Pt alloy powder)

were separately classified through 150 mesh sieves to obtain three atomized metal powders (Co powder, 69Co-22Cr-9Pt alloy powder, and 5Co-95Pt alloy powder) having a particle diameter of ϕ106 μm or smaller.

65.80 g of $SiO_2$ powder, 43.81 g of $TiO_2$ powder, and 124.95 g of $Cr_2O_3$ powder were added to 1,470.00 g of the classified Co powder and mixed and dispersed to obtain a magnetic powder mixture (the Co powder covered with the oxide powders). In the $SiO_2$ powder, $TiO_2$ powder, $Cr_2O_3$ powder used, the primary particles having a median diameter of 0.6 μm were aggregated to form secondary particles having a diameter of about ϕ100 μm. However, mixing and dispersing were carried out in a ball mill until the Co particles were densely covered with the oxide powders ($SiO_2$ powder, $TiO_2$ powder, and $Cr_2O_3$ powder) to thereby obtain the magnetic powder mixture (the Co powder covered with the oxide powders).

43.60 g of $SiO_2$ powder, 28.98 g of $TiO_2$ powder, and 82.76 g of $Cr_2O_3$ powder were added to 1,150.00 g of the classified 69Co-22Cr-9Pt alloy powder and mixed and dispersed to obtain a first non-magnetic powder mixture (the 69Co-22Cr-9Pt alloy powder covered with the oxide powders). In the $SiO_2$ powder, $TiO_2$ powder, $Cr_2O_3$ powder used, the primary particles having a median diameter of 0.6 μm were aggregated to form secondary particles having a diameter of about ϕ100 μm. However, mixing and dispersing were carried out in a ball mill until the 69Co-22Cr-9Pt alloy particles were densely covered with the oxide powders ($SiO_2$ powder, $TiO_2$ powder, and $Cr_2O_3$ powder) to thereby obtain the first non-magnetic powder mixture (the 69Co-22Cr-9Pt alloy powder covered with the oxide powders).

20.82 g of $SiO_2$ powder, 13.83 g of $TiO_2$ powder, and 39.32 g of $Cr_2O_3$ powder were added to 1,480.00 g of the classified 5Co-95Pt alloy powder and mixed and dispersed to obtain a second non-magnetic powder mixture (the 5Co-95Pt alloy powder covered with the oxide powders). In the $SiO_2$ powder, $TiO_2$ powder, $Cr_2O_3$ powder used, the primary particles having a median diameter of 0.6 μm were aggregated to form secondary particles having a diameter of about ϕ100 μm. However, mixing and dispersing were carried out in a ball mill until the 5Co-95Pt alloy particles were densely covered with the oxide powders ($SiO_2$ powder, $TiO_2$ powder, and $Cr_2O_3$ powder) to thereby obtain the second non-magnetic powder mixture (the 5Co-95Pt alloy powder covered with the oxide powders).

Then 805.67 g of the magnetic powder mixture (the Co powder covered with the oxide powders), 1,229.89 g of the first non-magnetic powder mixture (the 69Co-22Cr-9Pt alloy powder covered with the oxide powders), and 744.44 g of the second non-magnetic powder mixture (the 5Co-95Pt alloy powder covered with the oxide powders) were mixed and dispersed to obtain a powder mixture for pressure sintering. More specifically, the powders (the magnetic powder mixture, the first non-magnetic powder mixture, and the second non-magnetic powder mixture) were mixed and dispersed such that they were dispersed in each other substantially uniformly and were not reduced in particle diameter, and the powder mixture for pressure sintering was thereby produced.

30 g of the produced powder mixture for pressure sintering was subjected to a hot press under the conditions of a sintering temperature of 1,100° C. and a pressure of 31 MPa for 60 minutes in an atmosphere of $5\times10^{-2}$ Pa or lower to produce a test piece (ϕ30 mm). The thickness of the obtained test piece was about 4.5 mm. The density of the produced test piece was measured and found to be 9.041 (g/cm³). Since the theoretical density is 9.24 (g/cm²), the relative density was 97.85%.

Figure 8:
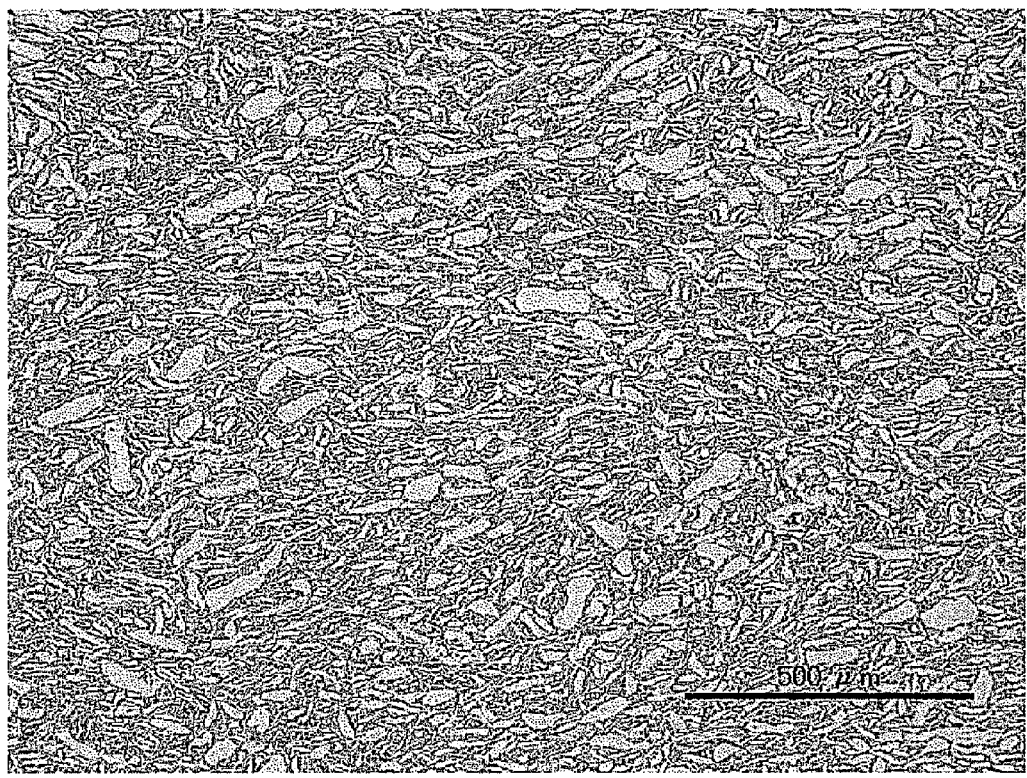
FIG. 8 is a metallurgical microscope photograph (at a low magnification) of a cross section of the test piece in Example 1 in the thickness direction.
Figure 9:
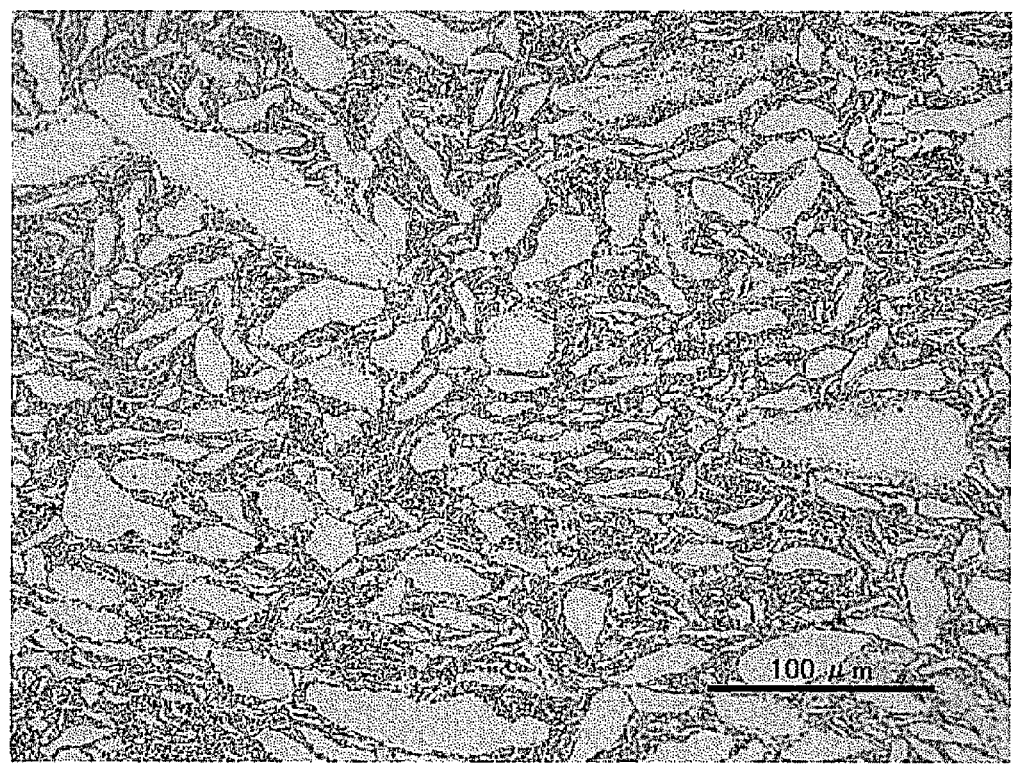
FIG. 9 is a metallurgical microscope photograph (at a high magnification) of a cross section of the test piece in Example 1 in the thickness direction.
Figure 10:
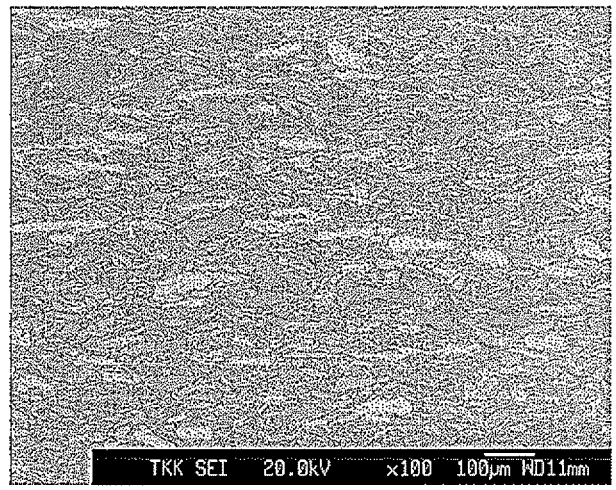
FIG. 10 is an SEM photograph (at a low magnification) of a cross section of the test piece in Example 1 in the thickness direction.
Figure 11:
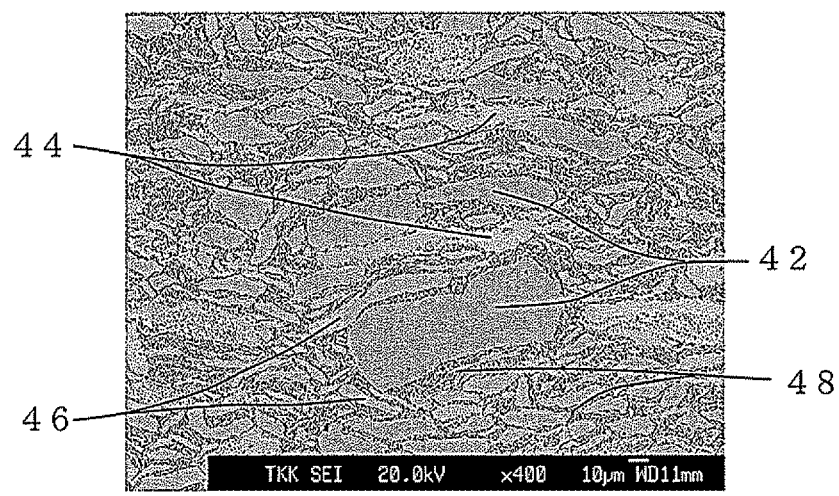
FIG. 11 is an SEM photograph (at a high magnification) of a cross section of the test piece in Example 1 in the thickness direction.

FIGS. 8 and 9 are metallurgical microscope photographs of a cross section of the obtained test piece in the thickness direction. FIG. 8 shows a low-magnification photograph, and FIG. 9 shows a high-magnification photograph. FIGS. 10 and 11 are SEM photographs of the cross section of the obtained test piece in the thickness direction. FIG. 10 shows a low-magnification photograph, and FIG. 11 shows a high-magnification photograph.

The results of elementary analysis by EPMA showed that, in the SEM photograph in FIG. 11, relatively large dark gray portions were the Co phase (reference numeral 42); whitest portions were the 5Co-95Pt alloy phase (reference numeral 44); portions with a gray density between those of the Co phase and the 5Co-95Pt alloy phase were the 69Co-22Cr-9Pt alloy phase (reference numeral 46); and dark gray portions separating these metal phases from each other were the oxide phase (the $SiO_2$—$TiO_2$—$Cr_2O_3$ phase) (reference numeral 48). It was found that the metal phases were separated from each other by the oxide phase ($SiO_2$—$TiO_2$—$Cr_2O_3$ phase) (reference numeral 48).

Next, the produced powder mixture for pressure sintering was subjected to a hot press under the conditions of a sintering temperature of 1,070° C. and a pressure of 31 MPa for 60 minutes in an atmosphere of $5\times10^{-2}$ Pa or lower to produce two targets with ϕ52.4 mm and a thickness of 7.0 mm. The densities of the two produced targets were measured and found to be 9.009 and 9.009 (g/cm³), respectively. Since the theoretical density is 9.24 (g/cm³), the relative densities were 97.50% and 97.50%.

The leakage magnetic flux from each of the two produced targets was evaluated according to ASTM F2086-01. A horseshoe-shaped magnet (formed of alnico) was used to generate the magnetic flux. This magnet was attached to an apparatus for measuring the leakage magnetic flux, and a gauss meter was connected to a hole probe. The hole probe was disposed so as to be positioned directly above the center between the magnetic poles of the horseshoe-shaped magnet.

First, a magnetic flux density in a direction horizontal to a table of the measuring apparatus was measured with no target placed on the surface of the table to measure a source field defined by ASTM. The source fields were 900 (G) and 900 (G).

Next, the tip of the hole probe was raised to the position at which the leakage magnetic flux from a target was measured (a position at a height of (the thickness of the target+2 mm) from the surface of the table), and a leakage magnetic flux density in a direction horizontal to the surface of the table was measured with no target placed on the surface of the table to measure a reference field defined by ASTM. The reference fields were 563 (G) and 572 (G).

Then a target was placed on the surface of the table such that the distance between the center of the surface of the target and a point on the target surface directly below the hole probe was 43.7 mm. The target was rotated 5 turns in an anticlockwise direction without moving its central position and then rotated by 0°, 30°, 60°, 90°, and 120° without moving the central position to measure the leakage magnetic flux density in a direction horizontal to the table surface at each of these rotated positions. The obtained five leakage magnetic flux density values were divided by the value of the reference field and multiplied by 100 to obtain leakage magnetic flux ratios (%). The five leakage magnetic flux ratios (%) were averaged, and the average value was used as the average leakage magnetic flux ratio (%) of the target. As shown in TABLES 3 and 4 below, the average leakage magnetic flux ratios of the two produced targets were 51.0% and 50.7%, respectively, and the average of these two average leakage magnetic flux ratios was 50.9%.

TABLE 3

| | Source Field (G) | Reference Field (G) | Leakage magnetic flux density (G) | Leakage magnetic flux ratio (%) |
|---|---|---|---|---|
| 0° | 900 | 563 | 285 | 50.6 |
| 30° | 900 | 563 | 287 | 51.0 |
| 60° | 900 | 563 | 285 | 50.6 |
| 90° | 900 | 563 | 289 | 51.3 |
| 120° | 900 | 563 | 291 | 51.7 |
| Average leakage magnetic flux ratio (%) | | | | 51.0 |

TABLE 4

| | Source Field (G) | Reference Field (G) | Leakage magnetic flux density (G) | Leakage magnetic flux ratio (%) |
|---|---|---|---|---|
| 0° | 900 | 572 | 291 | 50.9 |
| 30° | 900 | 572 | 290 | 50.7 |
| 60° | 900 | 572 | 290 | 50.7 |
| 90° | 900 | 572 | 289 | 50.5 |
| 120° | 900 | 572 | 289 | 50.5 |
| Average leakage magnetic flux ratio (%) | | | | 50.7 |

Example 2

The overall composition of a target produced in Example 2 was 91 (73Co-11Cr-16Pt)-4$SiO_2$-2$TiO_2$-3$Cr_2O_3$ and was the same as the composition in Example 1. However, Example 2 is different from Example 1 in that the second non-magnetic metal powder produced by atomization is a 10Co-90Pt alloy powder.

The target in Example 2 was produced and evaluated as follows.

Atomization and classification were performed as in Example 1 except that the alloy composition was changed to thereby obtain the 10Co-90Pt alloy powder. During atomization performed to obtain the 10Co-90Pt alloy powder, the heating temperature and the injection temperature were 2,000° C.

Mixing and dispersing were performed as in Example 1 except that 21.77 g of $SiO_2$ powder, 14.52 g of $TiO_2$ powder, and 41.50 g of $Cr_2O_3$ powder were added to 1,500.00 g of the obtained 10Co-90Pt alloy powder to thereby obtain a second non-magnetic powder mixture (the 10Co-90Pt alloy powder covered with the oxide powders).

Mixing and dispersing were performed as in Example 1 except that 64.91 g of $SiO_2$ powder, 43.22 g of $TiO_2$ powder, and 123.26 g of $Cr_2O_3$ powder were added to 1,450.00 g of the Co powder obtained by atomization in Example 1 to thereby obtain a magnetic powder mixture (the Co powder covered with the oxide powders).

Mixing and dispersing were performed as in Example 1 except that 43.60 g of $SiO_2$ powder, 28.98 g of $TiO_2$ powder, and 82.76 g of $Cr_2O_3$ powder were added to 1,150.00 g of the 69Co-22Cr-9Pt alloy powder obtained by atomization in Example 1 to thereby obtain a first non-magnetic powder mixture (the 69Co-22Cr-9Pt alloy powder covered with the oxide powders).

Then 791.37 g of the magnetic powder mixture (the Co powder covered with the oxide powders), 1229.89 g of the first non-magnetic powder mixture (the 69Co-22Cr-9Pt alloy powder covered with the oxide powders), and 758.74 g of the second non-magnetic powder mixture (the 10Co-90Pt alloy powder covered with the oxide powders) were mixed and dispersed as in Example 1 to obtain a powder mixture for pressure sintering.

30 g of the produced powder mixture for pressure sintering was subjected to a hot press under the conditions of a sintering temperature of 1,100° C. and a pressure of 31 MPa for 60 minutes in an atmosphere of $5 \times 10^{-2}$ Pa or lower to produce a test piece (φ30 mm). The thickness of the obtained test piece was about 4.5 mm. The density of the produced test piece was measured and found to be 9.052 (g/$cm^3$). Since the theoretical density is 9.24 (g/$cm^3$), the relative density was 97.96%.

Figure 12:
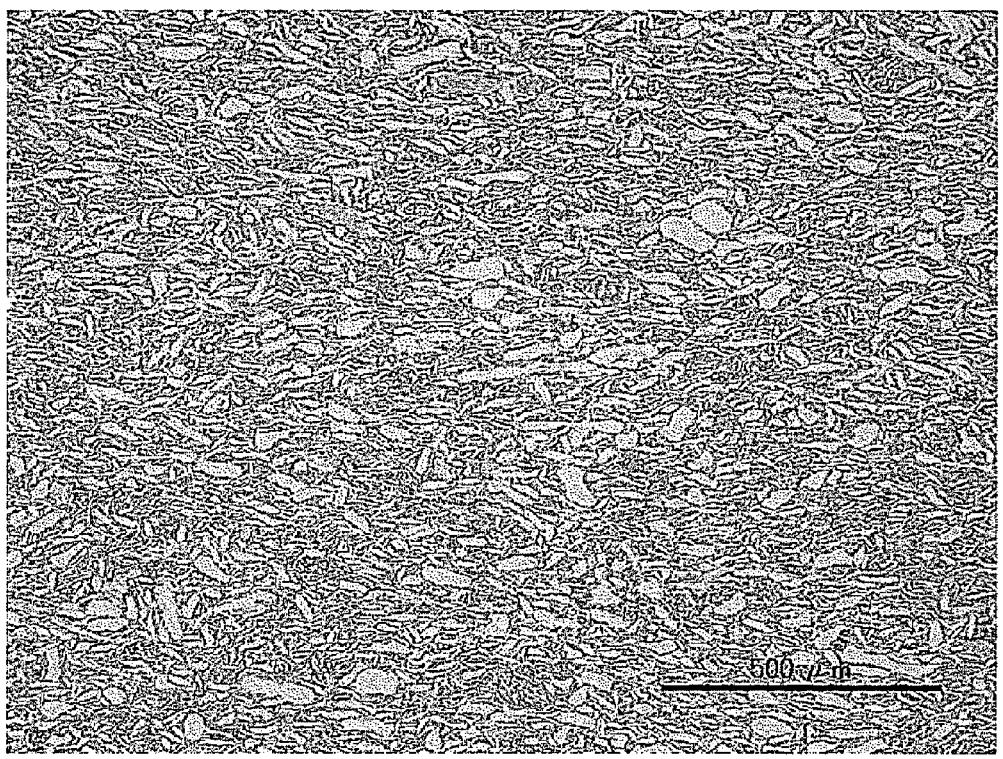
FIG. 12 is a metallurgical microscope photograph (at a low magnification) of a cross section of the test piece in Example 2 in the thickness direction.
Figure 13:
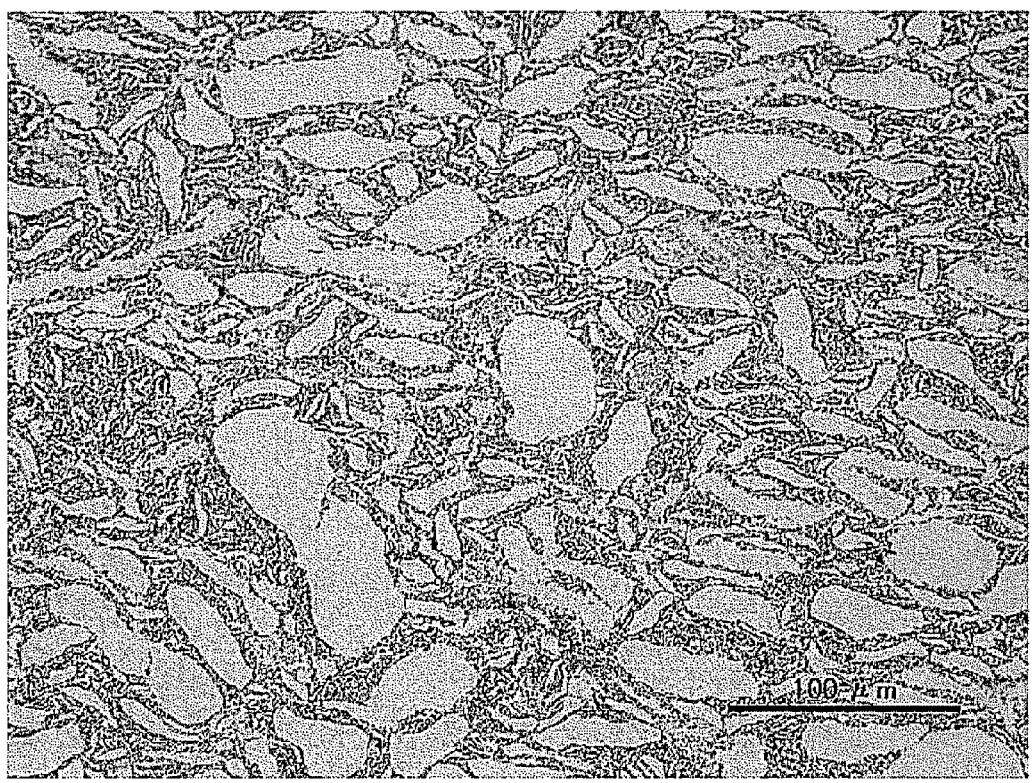
FIG. 13 is a metallurgical microscope photograph (at a high magnification) of a cross section of the test piece in Example 2 in the thickness direction.
Figure 14:
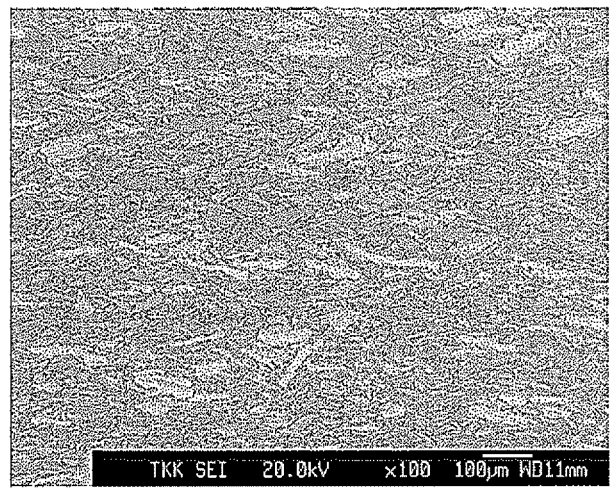
FIG. 14 is an SEM photograph (at a low magnification) of a cross section of the test piece in Example 2 in the thickness direction.
Figure 15:
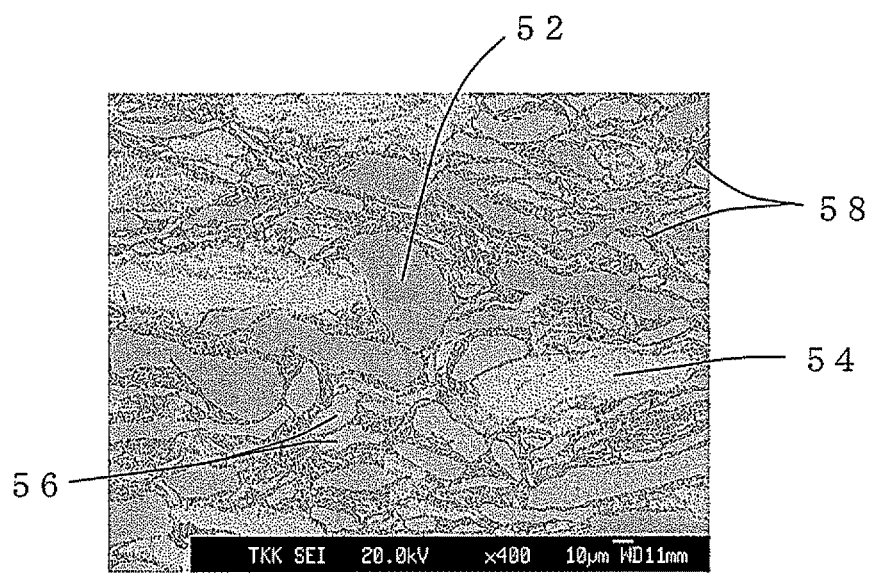
FIG. 15 is an SEM photograph (at a high magnification) of a cross section of the test piece in Example 2 in the thickness direction.

FIGS. 12 and 13 are metallurgical microscope photographs of a cross section of the obtained test piece in the thickness direction. FIG. 12 shows a low-magnification photograph, and FIG. 13 shows a high-magnification photograph. FIGS. 14 and 15 are SEM photographs of the cross section of the obtained test piece in the thickness direction. FIG. 14 shows a low-magnification photograph, and FIG. 15 shows a high-magnification photograph.

The results of elementary analysis by EPMA showed that, in the SEM photograph in FIG. 15, relatively large dark gray portions were the Co phase (reference numeral 52); whitest portions were the 10Co-90Pt phase (reference numeral 54); portions with a gray density between those of the Co phase and the 10Co-90Pt phase were the 69Co-22Cr-9Pt phase (reference numeral 56); and dark gray portions separating these metal phases from each other were the oxide phase (the $SiO_2$—$TiO_2$—$Cr_2O_3$ phase) (reference numeral 58). It was found that the metal phases were separated from each other by the oxide phase ($SiO_2^-$ $TiO_2$—$Cr_2O_3$ phase) (reference numeral 58).

Next, the produced powder mixture for pressure sintering was subjected to a hot press under the conditions of a sintering temperature of 1,080° C. and a pressure of 31 MPa for 60 minutes in an atmosphere of $5 \times 10^{-2}$ Pa or lower to produce two targets with φ152.4 mm and a thickness of 7.0 mm. The densities of the two produced targets were measured and found to be 9.023 and 9.014 (g/$cm^3$), respectively. Since the theoretical density is 9.24 (g/$cm^3$), the relative densities were 97.65% and 97.55%.

The leakage magnetic flux from each of the two produced targets was evaluated as in Example 1. As shown in TABLEs 5 and 6 below, the average leakage magnetic flux ratios were 50.6% and 50.7%, and the average of these average leakage magnetic flux ratios was 50.7%.

TABLE 5

| | Source Field (G) | Reference Field (G) | Leakage magnetic flux density (G) | Leakage magnetic flux ratio (%) |
|---|---|---|---|---|
| 0° | 902 | 575 | 288 | 50.1 |
| 30° | 902 | 575 | 293 | 51.0 |
| 60° | 902 | 575 | 291 | 50.6 |
| 90° | 902 | 575 | 292 | 50.8 |
| 120° | 902 | 575 | 289 | 50.3 |
| Average leakage magnetic flux ratio (%) | | | | 50.6 |

TABLE 6

| | Source Field (G) | Reference Field (G) | Leakage magnetic flux density (G) | Leakage magnetic flux ratio (%) |
|---|---|---|---|---|
| 0° | 902 | 564 | 286 | 50.7 |
| 30° | 902 | 564 | 285 | 50.5 |
| 60° | 902 | 564 | 285 | 50.5 |

TABLE 6-continued

|  | Source Field (G) | Reference Field (G) | Leakage magnetic flux density (G) | Leakage magnetic flux ratio (%) |
|---|---|---|---|---|
| 90° | 902 | 564 | 287 | 50.9 |
| 120° | 902 | 564 | 286 | 50.7 |
| Average leakage magnetic flux ratio (%) | | | | 50.7 |

Comparative Example 1

The overall composition of a target produced in Comparative Example 1 was 91 (73Co-11Cr-16Pt)-4SiO$_2$-2TiO$_2$-3Cr$_2$O$_3$ and was the same as those in Examples 1 and 2. However, Comparative Example 1 is different from Examples 1 and 2 in that the target was produced using a 50Co-50Pt alloy powder which is the magnetic metal powder instead of the second non-magnetic metal powders (5Co-95Pt alloy powder and 10Co-90Pt alloy powder) used in Examples 1 and 2. In Comparative Example 1, the number of non-magnetic phases is one (the number of magnetic phases is two, that is the Co phase and the 50Co-50Pt alloy phase).

The target in Comparative Example 1 was produced and evaluated as follows.

Atomization and classification were performed as in Example 1 except that the alloy composition was changed to thereby obtain the 50Co-50Pt alloy powder. During atomization performed to obtain the 50Co-50Pt alloy powder, the heating temperature and the injection temperature were 1,800° C.

Mixing and dispersing were performed as in Example 1 except that 38.55 g of SiO$_2$ powder, 25.63 g of TiO$_2$ powder, and 72.93 g of Cr$_2$O$_3$ powder were added to 1,850.00 g of the obtained 50Co-50Pt alloy powder to thereby obtain a second non-magnetic powder mixture (the 50Co-50Pt alloy powder covered with the oxide powders).

Mixing and dispersing were performed as in Example 1 except that 48.34 g of SiO$_2$ powder, 32.19 g of TiO$_2$ powder, and 91.81 g of Cr$_2$O$_3$ powder were added to 1,080.00 g of the Co powder obtained by atomization in Example 1 to thereby obtain a first magnetic powder mixture (the Co powder covered with the oxide powders).

Mixing and dispersing were performed as in Example 1 except that 43.60 g of SiO$_2$ powder, 28.98 g of TiO$_2$ powder, and 82.76 g of Cr$_2$O$_3$ powder were added to 1,150.00 g of the 69Co-22Cr-9Pt alloy powder obtained in Example 1 to thereby obtain a first non-magnetic powder mixture (the 69Co-22Cr-9Pt alloy powder covered with the oxide powders).

Then 574.04 g of the magnetic powder mixture (the Co powder covered with the oxide powders), 1229.89 g of the first non-magnetic powder mixture (the 69Co-22Cr-9Pt alloy powder covered with the oxide powders), and 976.07 g of the second magnetic powder mixture (the 50Co-50Pt alloy powder covered with the oxide powders) were mixed and dispersed as in Example 1 to obtain a powder mixture for pressure sintering.

30 g of the produced powder mixture for pressure sintering was subjected to a hot press under the conditions of a sintering temperature of 1,100° C. and a pressure of 31 MPa for 60 minutes in an atmosphere of 5×10$^{-2}$ Pa or lower to produce a test piece (φ30 mm). The thickness of the obtained test piece was about 4.5 mm. The density of the produced test piece was measured and found to be 9.023 (g/cm$^2$). Since the theoretical density is 9.24 (g/cm$^3$), the relative density was 97.65%.

Figure 16:
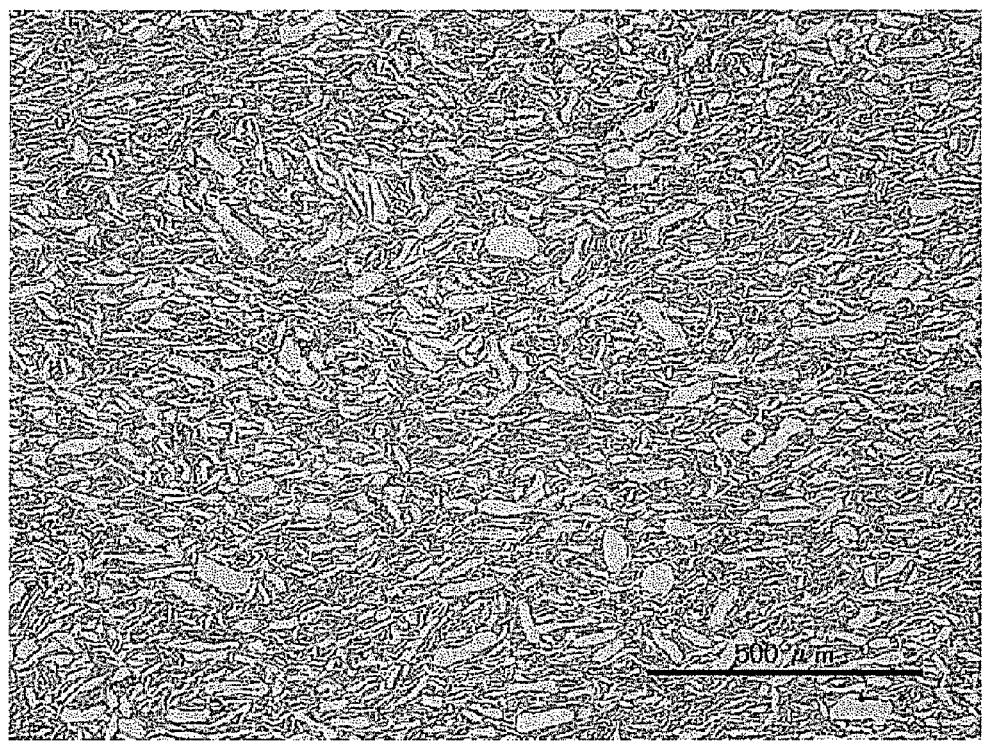
FIG. 16 is a metallurgical microscope photograph (at a low magnification) of a cross section of the test piece in Comparative Example 1 in the thickness direction.
Figure 17:
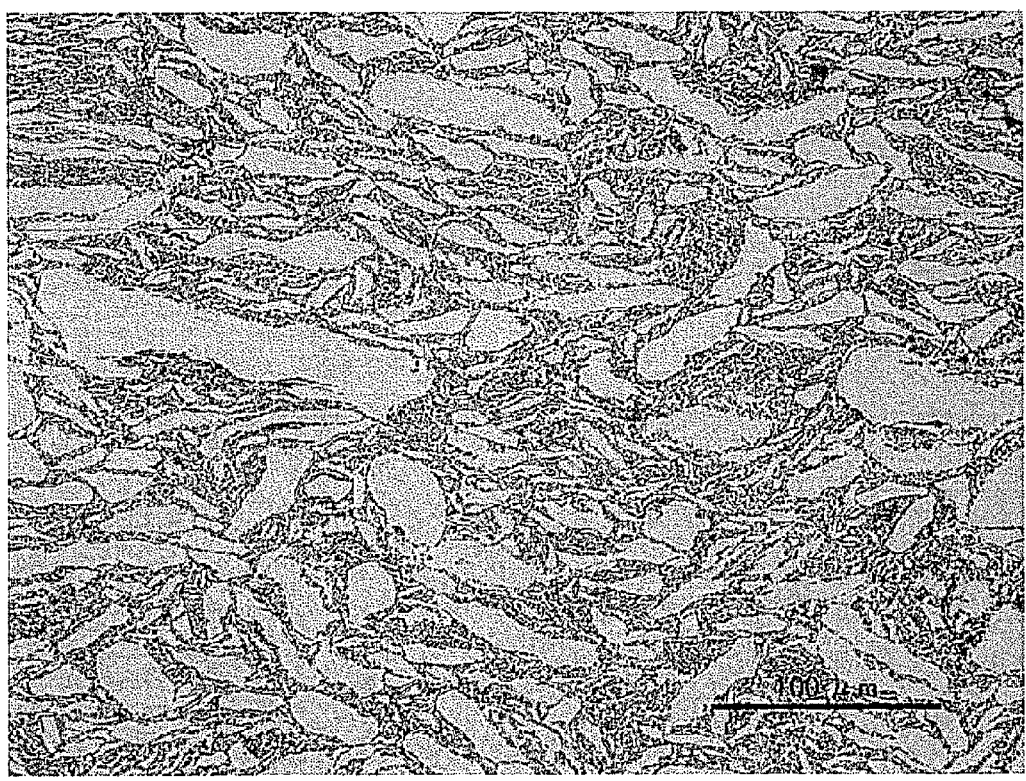
FIG. 17 is a metallurgical microscope photograph (at a high magnification) of a cross section of the test piece in Comparative Example 1 in the thickness direction.
Figure 18:
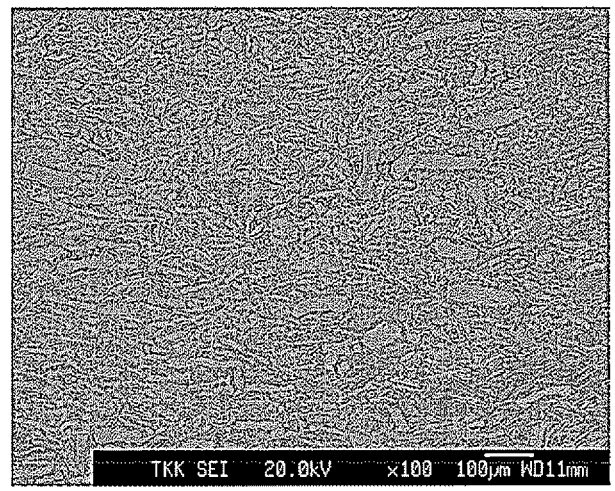
FIG. 18 is an SEM photograph (at a low magnification) of a cross section of the test piece in Comparative Example 1 in the thickness direction.
Figure 19:
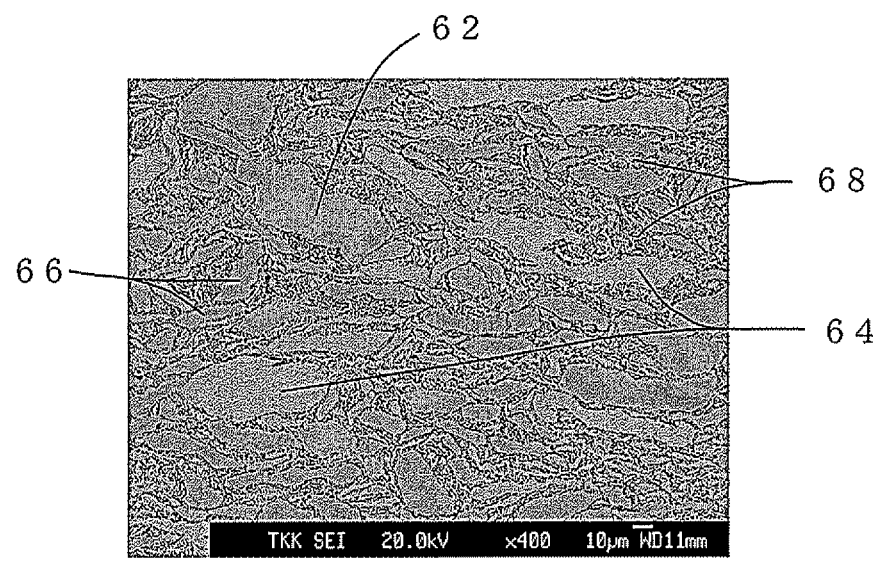
FIG. 19 is an SEM photograph (at a high magnification) of a cross section of the test piece in Comparative Example 1 in the thickness direction.

FIGS. 16 and 17 are metallurgical microscope photographs of a cross section of the obtained test piece in the thickness direction. FIG. 16 shows a low-magnification photograph, and FIG. 17 shows a high-magnification photograph. FIGS. 18 and 19 are SEM photographs of the cross section of the obtained test piece in the thickness direction. FIG. 18 shows a low-magnification photograph, and FIG. 19 shows a high-magnification photograph.

The results of elementary analysis by EPMA showed that, in the SEM photograph in FIG. 19, relatively large dark gray portions were the Co phase (reference numeral 62); whitest portions were the 50Co-50Pt alloy phase (reference numeral 64); portions with a gray density between those of the Co phase and the 50Co-50Pt alloy phase were the 69Co-22Cr-9Pt phase (reference numeral 66); and dark gray portions separating these metal phases from each other were the oxide phase (the SiO$_2$—TiO$_2$—Cr$_2$O$_3$ phase) (reference numeral 68). It was found that the metal phases were separated from each other by the oxide phase (SiO$_2$—TiO$_2$—Cr$_2$O$_3$ phase) (reference numeral 68).

Next, the produced powder mixture for pressure sintering was subjected to a hot press under the conditions of a sintering temperature of 1,090° C. and a pressure of 31 MPa for 60 minutes in an atmosphere of 5×10$^{-2}$ Pa or lower to produce two targets with φ152.4 mm and a thickness of 7.0 mm. The densities of the two produced targets were measured and found to be 9.071 and 9.065 (g/cm$^3$), respectively. Since the theoretical density is 9.24 (g/cm$^2$), the relative densities were 98.17% and 98.11%.

The leakage magnetic flux from each of the two produced targets was evaluated as in Example 1. As shown in TABLES 7 and 8 below, the average leakage magnetic flux ratios were 44.8% and 44.9%, and the average of these average leakage magnetic flux ratios was 44.9%.

TABLE 7

|  | Source Field (G) | Reference Field (G) | Leakage magnetic flux density (G) | Leakage magnetic flux ratio (%) |
|---|---|---|---|---|
| 0° | 897 | 581 | 257 | 44.2 |
| 30° | 897 | 581 | 261 | 44.9 |
| 60° | 897 | 581 | 262 | 45.1 |
| 90° | 897 | 581 | 261 | 44.9 |
| 120° | 897 | 581 | 260 | 44.8 |
| Average leakage magnetic flux ratio (%) | | | | 44.8 |

TABLE 8

|  | Source Field (G) | Reference Field (G) | Leakage magnetic flux density (G) | Leakage magnetic flux ratio (%) |
|---|---|---|---|---|
| 0° | 897 | 569 | 254 | 44.6 |
| 30° | 897 | 569 | 255 | 44.8 |
| 60° | 897 | 569 | 257 | 45.2 |
| 90° | 897 | 569 | 255 | 44.8 |
| 120° | 897 | 569 | 256 | 45.0 |
| Average leakage magnetic flux ratio (%) | | | | 44.9 |

Comparative Example 2

The overall composition of a target produced in Comparative Example 2 was 91 (73Co-11Cr-16Pt)-4SiO$_2$-2TiO$_2$-3Cr$_2$O$_3$ and was the same as those in Examples 1 and 2 and Comparative Example 1. The magnetic metal powder used to produce the target was a Co powder, and the first non-magnetic metal powder was a 69Co-22Cr-9Pt alloy powder. The second magnetic metal powder was a 50Co-50Pt alloy powder, and the compositions of these three metal powders used to produce the target were the same as those in Comparative Example 1.

However, in Comparative Example 2, the above-described three metal powders and the oxide powders (SiO₂ powder, TiO₂ powder, and Cr₂O₃ powder) were mixed and dispersed simultaneously (in one step) to produce a powder mixture for pressure sintering. This is the difference from Examples 1 and 2 and Comparative Example 1 in which three metal powders are separately mixed with and dispersed in oxide powders (SiO₂ powder, TiO₂ powder, and Cr₂O₃ powder) and then the obtained three powder mixtures are mixed with each other to obtain a powder mixture for pressure sintering (through two mixing steps).

The target in Comparative Example 2 was produced and evaluated as follows.

254.74 g of the Co powder obtained by atomization in Example 1, 557.61 g of the 69Co-22Cr-9Pt alloy powder obtained by atomization in Example 1, 467.65 g of the 50Co-50Pt alloy powder obtained by atomization in Comparative Example 1, 42.35 g of SiO₂ powder, 28.18 g of TiO₂ powder, and 80.26 g of Cr₂O₃ powder were mixed and dispersed simultaneously to obtain a powder mixture for pressure sintering in one mixing step. More specifically, these powders were mixed and dispersed in a ball mill at the same strength as that in Example 1 for the same time period as that in Example 1 to produce the powder mixture for pressure sintering in one mixing step.

30 g of the produced powder mixture for pressure sintering was subjected to a hot press under the conditions of a sintering temperature of 1,100° C. and a pressure of 24.5 MPa for 60 minutes in an atmosphere of 5×10⁻² Pa or lower to produce a test piece (φ30 mm). The thickness of the obtained test piece was about 4.5 mm. The density of the produced test piece was measured and found to be 9.027 (g/cm³). Since the theoretical density is 9.24 (g/cm³), the relative density was 97.69%.

Figure 20:
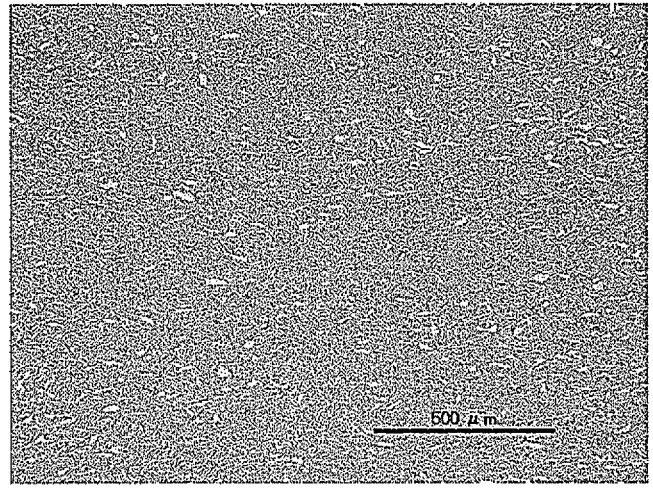
FIG. 20 is a metallurgical microscope photograph (at a low magnification) of a cross section of the test piece in Comparative Example 2 in the thickness direction.
Figure 21:
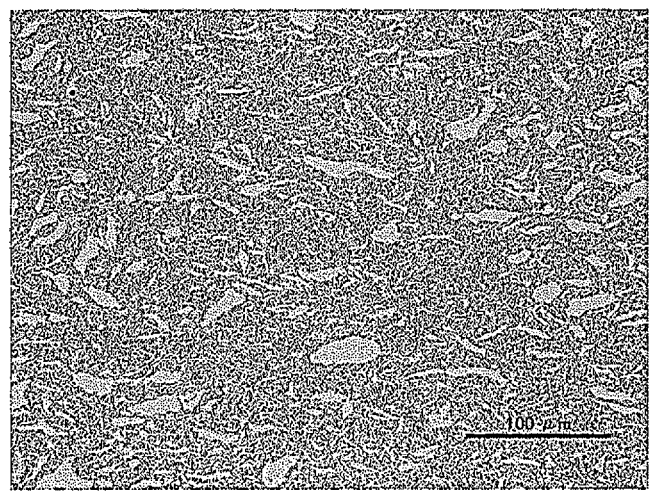
FIG. 21 is a metallurgical microscope photograph (at a high magnification) of a cross section of the test piece in Comparative Example 2 in the thickness direction.
Figure 22:
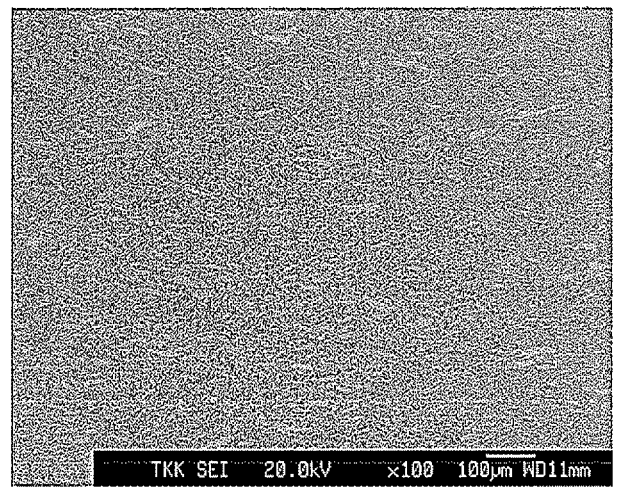
FIG. 22 is an SEM photograph (at a low magnification) of a cross section of the test piece in Comparative Example 2 in the thickness direction.
Figure 23:
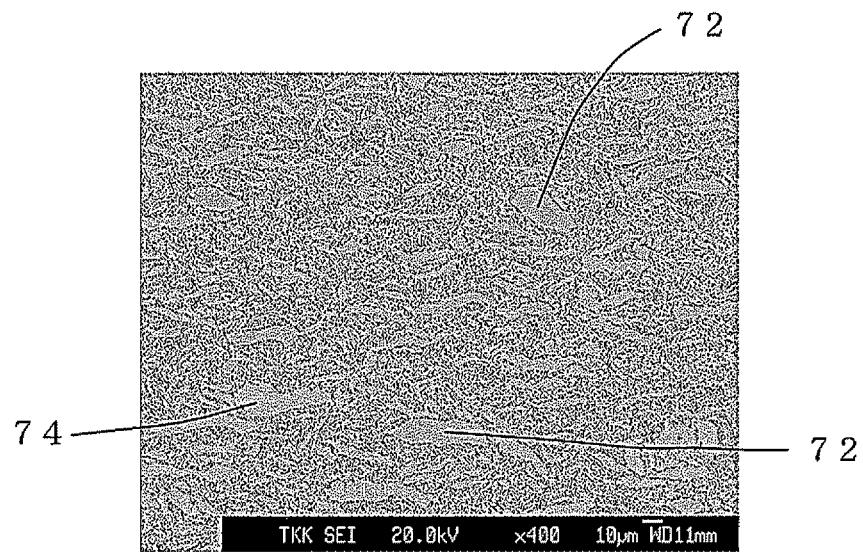
FIG. 23 is an SEM photograph (at a high magnification) of a cross section of the test piece in Comparative Example 2 in the thickness direction.

FIGS. 20 and 21 are metallurgical microscope photographs of a cross section of the obtained test piece in the thickness direction. FIG. 20 shows a low-magnification photograph, and FIG. 21 shows a high-magnification photograph. FIGS. 22 and 23 are SEM photographs of the cross section of the obtained test piece in the thickness direction. FIG. 22 shows a low-magnification photograph, and FIG. 23 shows a high-magnification photograph.

The results of elementary analysis by EPMA showed that, in an SEM photograph in FIG. 23, almost all portions observed as metal phases were the Co phase (reference numeral 72) and relatively large portions observed as the 50Co-50Pt alloy phase (reference numeral 74) were portions shown in FIG. 23. Other portions were phases of mixtures of metals and oxides, and it was considered that the regions of the metal phase were not separated from each other by the oxide phase.

Next, the produced powder mixture for pressure sintering was subjected to a hot press under the conditions of a sintering temperature of 1,100° C. and a pressure of 24.5 MPa for 60 minutes in an atmosphere of 5×10⁻² Pa or lower to produce a target with φ152.4 mm and a thickness of 7.0 mm.

Another target with φ152.4 mm and a thickness of 7.0 mm was produced using the same process as the above-described production process.

The densities of the two produced targets were measured and found to be 9.07 and 9.06 (g/cm³), respectively. Since the theoretical density is 9.24 (g/cm³), the relative densities were 98.2% and 98.1%.

The leakage magnetic flux from each of the two produced targets was evaluated as in Example 1. As shown in TABLES 9 and 10 below, the average leakage magnetic flux ratios were 31.9% and 31.5%, and the average of these average leakage magnetic flux ratios was 31.7%.

TABLE 9

| | Source Field (G) | Reference Field (G) | Leakage magnetic flux density (G) | Leakage magnetic flux ratio (%) |
|---|---|---|---|---|
| 0° | 902 | 565 | 180 | 31.9 |
| 30° | 902 | 565 | 181 | 32.0 |
| 60° | 902 | 565 | 181 | 32.0 |
| 90° | 902 | 565 | 180 | 31.9 |
| 120° | 902 | 565 | 180 | 31.9 |
| Average leakage magnetic flux ratio (%) | | | | 31.9 |

TABLE 10

| | Source Field (G) | Reference Field (G) | Leakage magnetic flux density (G) | Leakage magnetic flux ratio (%) |
|---|---|---|---|---|
| 0° | 902 | 585 | 184 | 31.5 |
| 30° | 902 | 585 | 184 | 31.5 |
| 60° | 902 | 585 | 184 | 31.5 |
| 90° | 902 | 585 | 184 | 31.5 |
| 120° | 902 | 585 | 184 | 31.5 |
| Average leakage magnetic flux ratio (%) | | | | 31.5 |

Comparative Example 3

The overall composition of a target produced in Comparative Example 3 was 91 (71Co-11Cr-18Pt)-3SiO₂-2TiO₂-4Cr₂O₃. The ratio of the amount of Co with respect to the total amount of the metals (Co, Cr, and Pt) in the target was 71 at %, the ratio of the amount of Cr was 11 at %, and the ratio of the amount of Pt was 18 at %.

The magnetic metal powder used to produce the target in Comparative Example 3 was a Co powder. The first non-magnetic metal powder was a 69Co-22Cr-9Pt alloy powder, and the second non-magnetic metal powder was a Pt powder. In Comparative Example 3, one of the two non-magnetic metal powders, i.e., the first non-magnetic metal powder (69Co-22Cr-9Pt alloy powder) contained Co which is a ferromagnetic metal element, but the second non-magnetic metal powder (Pt powder) contained no ferromagnetic metal element.

The target in Comparative Example 3 was produced and evaluated as follows.

Co alone was heated to 1,700° C. to obtain molten Co, and the molten Co was gas-atomized to produce a Co powder (magnetic metal powder).

Co, Cr, and Pt were weighed such that an alloy to be produced had an alloy composition of Co: 69 at %, Cr: 22 at %, and Pt: 9 at % and were heated to 1,700° C. to form a molten 69Co-22Cr-9Pt alloy. The molten alloy was gas-atomized to produce a 69Co-22Cr-9Pt alloy powder (first non-magnetic metal powder).

Pt alone was heated to 2,000° C. to obtain molten Pt, and the molten Pt was gas-atomized to produce a Pt powder (non-magnetic metal powder).

The obtained metal powders were classified as in Example 1 to obtain a Co powder, a 69Co-22Cr-9Pt alloy powder, and a Pt powder.

Mixing and dispersing were performed as in Example 1 except that 23.56 g of SiO₂ powder, 20.84 g of TiO₂ powder, and 79.32 g of Cr₂O₃ powder were added to 700.00 g of the classified Co powder to thereby obtain a magnetic powder mixture (the Co powder covered with the oxide powders).

Mixing and dispersing were performed as in Example 1 except that 29.81 g of SiO₂ powder, 26.43 g of TiO₂ powder, and 100.67 g of Cr₂O₃ powder were added to 1050.00 g of the classified 69Co-22Cr-9Pt alloy powder to thereby obtain a first non-magnetic powder mixture (the 69Co-22Cr-9Pt alloy powder covered with the oxide powders).

Mixing and dispersing were performed as in Example 1 except that 8.49 g of $SiO_2$ powder, 7.52 g of $TiO_2$ powder, and 28.76 g of $Cr_2O_3$ powder were added to 840.00 g of the classified Pt powder to thereby obtain a second non-magnetic powder mixture (the Pt powder covered with the oxide powders).

Then 738.62 g of the magnetic powder mixture (the Co powder covered with the oxide powders), 1107.63 g of the first non-magnetic powder mixture (the 69Co-22Cr-9Pt alloy powder covered with the oxide powders), and 653.75 g of the second non-magnetic powder mixture (the Pt powder covered with the oxide powders) were mixed and dispersed as in Example 1 to produce a powder mixture for pressure sintering.

30 g of the produced powder mixture for pressure sintering was subjected to a hot press under the conditions of a sintering temperature of 1,070° C. and a pressure of 31 MPa for 60 minutes in an atmosphere of $5 \times 10^{-2}$ Pa or lower to produce a test piece (ϕ30 mm). The thickness of the obtained test piece was about 4.5 mm. The density of the produced test piece was measured and found to be 9.375 (g/cm$^2$). Since the theoretical density is 9.56 (g/cm$^3$), the relative density was 98.06%.

Figure 24:
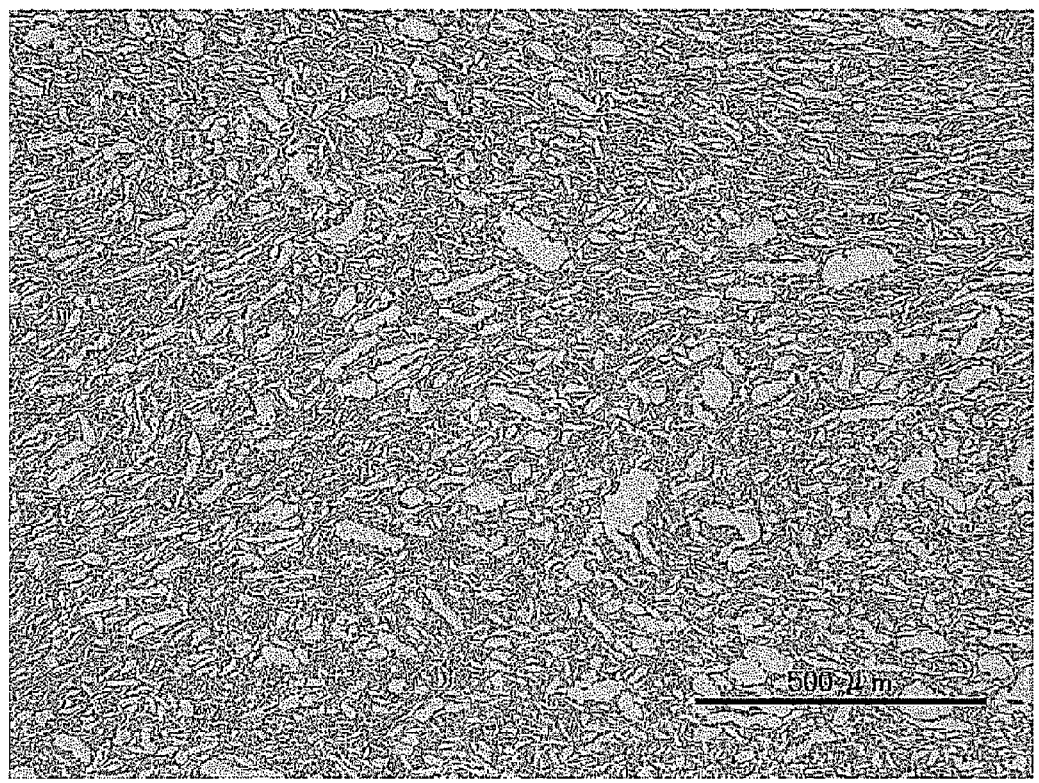
FIG. 24 is a metallurgical microscope photograph (at a low magnification) of a cross section of the test piece in Comparative Example 3 in the thickness direction.
Figure 25:
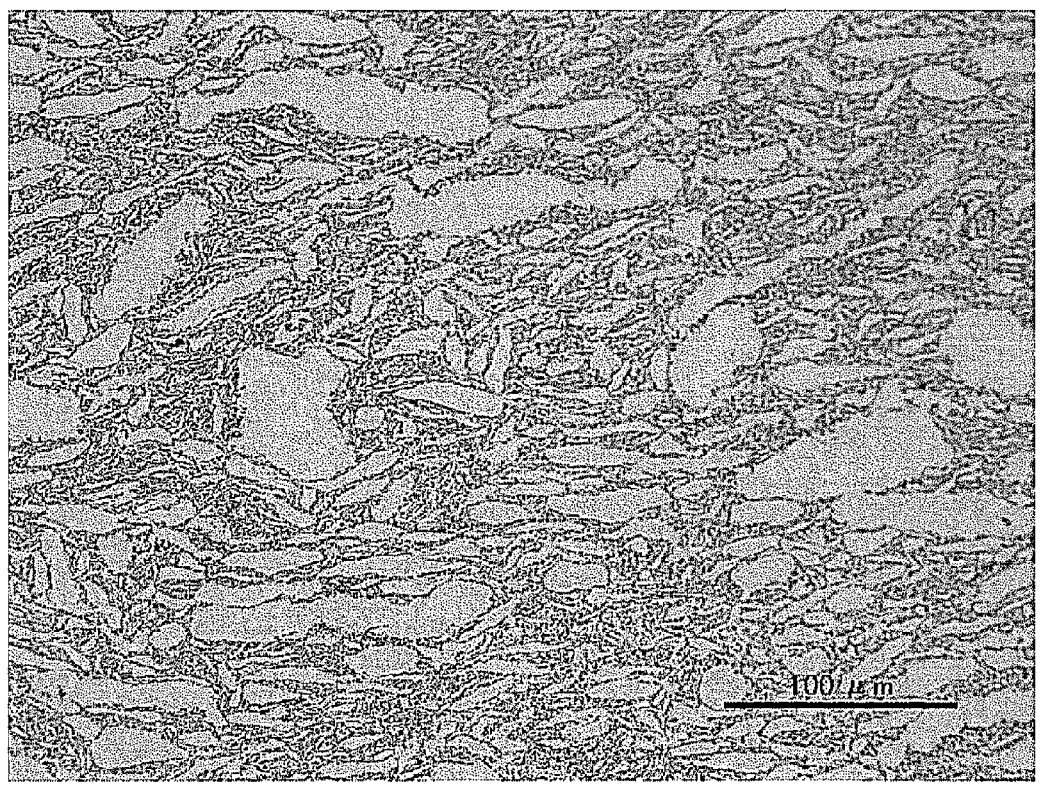
FIG. 25 is a metallurgical microscope photograph (at a high magnification) of a cross section of the test piece in Comparative Example 3 in the thickness direction.

FIGS. 24 and 25 are metallurgical microscope photographs of a cross section of the obtained test piece in the thickness direction. FIG. 24 shows a low-magnification photograph, and FIG. 25 shows a high-magnification photograph.

In FIGS. 24 and 25, whitish portions are the metal phases (the Co phase, the 69Co-22Cr-9Pt alloy phase, and the Pt phase), and dark gray portions separating these metal phases from each other are the oxide phase ($SiO_2$—$TiO_2$—$Cr_2O_3$ phase). The regions of the metal phases are separated from each other by the oxide phase ($SiO_2$—$TiO_2$—$Cr_2O_3$ phase).

Next, the produced powder mixture for pressure sintering was subjected to a hot press under the conditions of a sintering temperature of 1,030° C. and a pressure of 31 MPa for 60 minutes in an atmosphere of $5 \times 10^{-2}$ Pa or lower to produce a target with ϕ152.4 mm and a thickness of 6.0 mm. The densities of the produced target were measured and found to be 9.388 (g/cm$^2$). Since the theoretical density is 9.56 (g/cm$^3$), the relative densities were 98.20%.

The leakage magnetic flux from the produced target was evaluated as in Example 1. As shown in TABLE 11 below, the average leakage magnetic flux ratio was 50.3%.

TABLE 11

| | Source Field (G) | Reference Field (G) | Leakage magnetic flux density (G) | Leakage magnetic flux ratio (%) |
|---|---|---|---|---|
| 0° | 905 | 580 | 293 | 50.5 |
| 30° | 905 | 580 | 292 | 50.3 |
| 60° | 905 | 580 | 290 | 50.0 |
| 90° | 905 | 580 | 292 | 50.3 |
| 120° | 905 | 580 | 291 | 50.2 |
| Average leakage magnetic flux ratio (%) | | | | 50.3 |

Comparative Example 4

A target with ϕ152.4 mm and a thickness of 6.0 mm was produced as in Comparative Example 3 except that the sintering temperature when the target with ϕ152.4 mm and a thickness of 6.0 mm was produced was 1,000° C., which was lower than the sintering temperature in Comparative Example 3 which is 1,030° C.

The leakage magnetic flux from the produced target was evaluated as in Example 1. As shown in TABLE 12 below, the average leakage magnetic flux ratio was 51.0%.

TABLE 12

| | Source Field (G) | Reference Field (G) | Leakage magnetic flux density (G) | Leakage magnetic flux ratio (%) |
|---|---|---|---|---|
| 0° | 900 | 612 | 311 | 50.8 |
| 30° | 900 | 612 | 312 | 51.0 |
| 60° | 900 | 612 | 311 | 50.8 |
| 90° | 900 | 612 | 313 | 51.1 |
| 120° | 900 | 612 | 313 | 51.1 |
| Average leakage magnetic flux ratio (%) | | | | 51.0 |

Comparative Example 5

In Examples 1 and 2 and Comparative Examples 1 to 4, three atomized metal powders were used to produce targets. However, in Comparative Example 5, only one 71Co-11Cr-18Pt alloy powder was used as the atomized metal powder used to produce a target.

The overall composition of the produced target was 91 (71Co-11Cr-18Pt)-3$SiO_2$-2$TiO_2$-4$Cr_2O_3$ and was the same as those in Comparative Examples 3 and 4.

The target in Comparative Example 5 was produced and evaluated as follows.

Co, Cr, and Pt were weighed such that an alloy to be produced had an alloy composition of Co: 71 at %, Cr: 11 at %, and Pt: 18 at %, and the mixture was heated to 1,700° C. to form a molten 71Co-11Cr-18Pt alloy. The molten alloy was gas-atomized to produce a 71Co-11Cr-18Pt alloy powder. The produced alloy powder was classified as in Example 1 to obtain a classified 71Co-11Cr-18Pt alloy powder.

27.34 g of $SiO_2$ powder, 24.26 g of $TiO_2$ powder, and 92.17 g of $Cr_2O_3$ powder were added to 1,140.00 g of the classified 71Co-11Cr-18Pt alloy powder and mixed and dispersed to obtain a powder mixture for pressure sintering (the 71Co-11Cr-18Pt alloy powder covered with the oxide powders). In the $SiO_2$ powder, $TiO_2$ powder, $Cr_2O_3$ powder used, the primary particles having a median diameter of 0.6 μm were aggregated to form secondary particles having a diameter of about ϕ100 μm. However, mixing and dispersing were carried out in a ball mill until the 71Co-11Cr-18Pt alloy particles were densely covered with the oxide powders ($SiO_2$ powder, $TiO_2$ powder, and $Cr_2O_3$ powder) to thereby obtain a powder mixture for pressure sintering (the 71Co-11Cr-18Pt alloy powder covered with the oxide powders).

30 g of the produced powder mixture for pressure sintering was subjected to a hot press under the conditions of a sintering temperature of 1,160° C. and a pressure of 24.5 MPa for 60 minutes in an atmosphere of $5 \times 10^{-2}$ Pa or lower to produce a test piece (ϕ30 mm). The thickness of the obtained test piece was about 4.5 mm. The density of the produced test piece was measured and found to be 9.402 (g/cm$^3$). Since the theoretical density is 9.56 (g/cm$^3$), the relative density was 98.35%.

Figure 26:
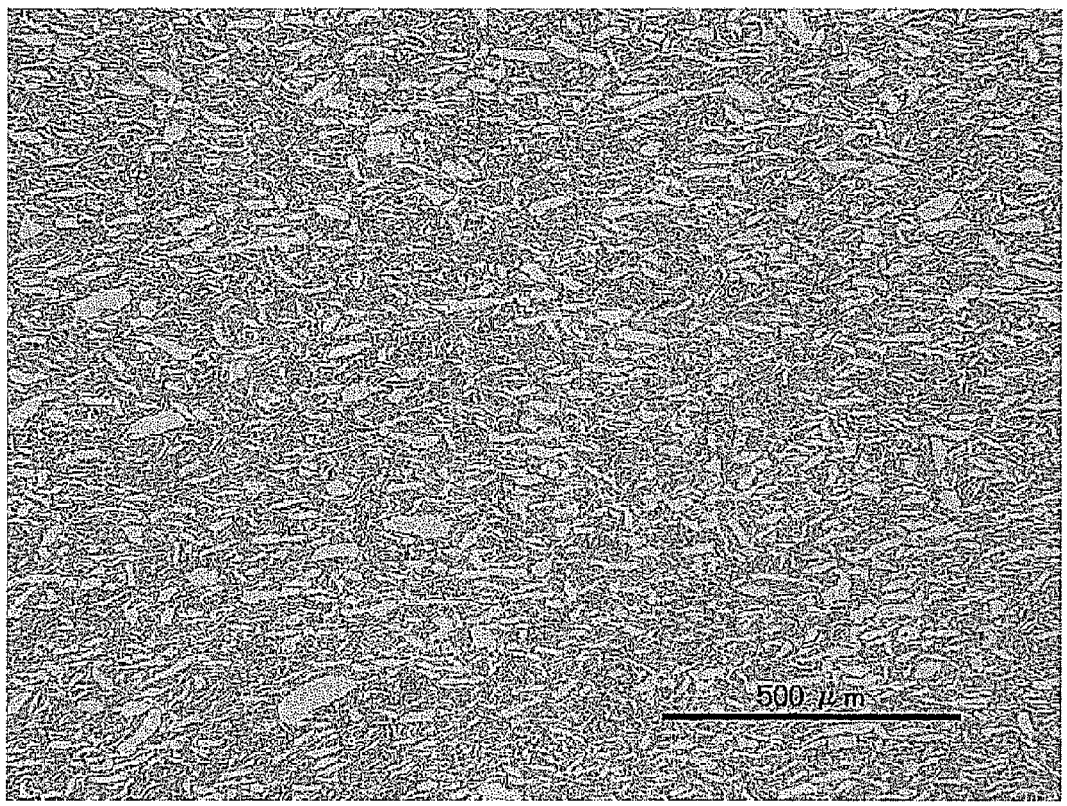
FIG. 26 is a metallurgical microscope photograph (at a low magnification) of a cross section of the test piece in Comparative Example 5 in the thickness direction.
Figure 27:
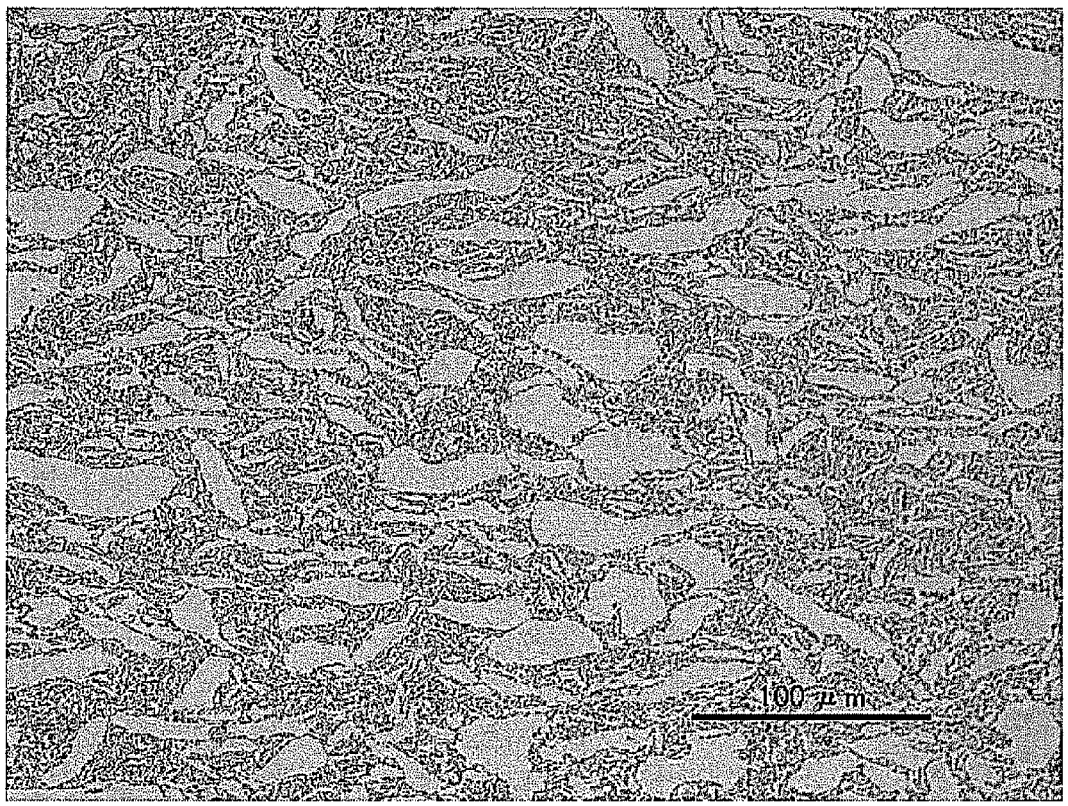
FIG. 27 is a metallurgical microscope photograph (at a high magnification) of a cross section of the test piece in Comparative Example 5 in the thickness direction.

FIGS. 26 and 27 are metallurgical microscope photographs of a cross section of the obtained test piece in the thickness direction. FIG. 26 shows a low-magnification photograph, and FIG. 27 shows a high-magnification photograph.

In FIGS. 26 and 27, whitish portions are the metal phase (71Co-11Cr-18Pt phase). As compared with FIGS. 24 and 25 in Comparative Example 3, the size of the metal phase (the whitish portions) is smaller, and the area of the dark gray portions is larger. Therefore, in Comparative Example 5, the metal phase is considered to be finer than those in Comparative Examples 3 and 4, and regions in which the metal phase and the oxide phase are finely dispersed in each other are considered to be larger.

Next, the produced powder mixture for pressure sintering was subjected to a hot press under the conditions of a sintering temperature of 1,160° C. and a pressure of 24.5 MPa for 60 minutes in an atmosphere of $5 \times 10^{-2}$ Pa or lower to produce a target with $\phi$152.4 mm and a thickness of 6.0 mm. The den- Comparative Examples 3 to 5, the ratio of the amount of Co contained in the target was 64.61 mol %. Therefore, the ratio of the amount of Co which is the ferromagnetic metal element was smaller in the targets in Comparative Examples 3 to 5. Thus, it should be noted that, also from the viewpoint of the ratio of the amount of Co which is the ferromagnetic metal element, the measured average leakage magnetic flux ratio tends to be larger in Comparative Examples 3 to 5 than in Examples 1 and 2 and Comparative Examples 1 and 2.

TABLE 14

| | Magnetic phase | First non-magnetic phase | Second non-magnetic phase or second magnetic phase | Mixing method | Sintering conditions | Average leakage magnetic flux ratio (%) |
|---|---|---|---|---|---|---|
| Example 1 | Co | 69Co—22Cr—9Pt | 5Co—95Pt | two steps | 1070° C., 31 MPa | 50.9 |
| Example 2 | Co | 69Co—22Cr—9Pt | 10Co—90Pt | two steps | 1080° C., 31 MPa | 50.7 |
| Comparative Example 1 | Co | 69Co—22Cr—9Pt | 50Co—50Pt | two steps | 1090° C., 31 MPa | 44.9 |
| Comparative Example 2 | Co | 69Co—22Cr—9Pt | 50Co—50Pt | one step | 1100° C., 24.5 MPa | 31.7 |
| Comparative Example 3 | Co | 69Co—22Cr—9Pt | Pt | two steps | 1030° C., 31 MPa | 50.3 |
| Comparative Example 4 | Co | 69Co—22Cr—9Pt | Pt | two steps | 1000° C., 31 MPa | 51.0 |
| Comparative Example 5 | | 71Co—11Cr—18Pt | | one step | 1160° C., 24.5 MPa | 40.0 | sities of the produced target were measured and found to be 9.397 (g/cm$^3$). Since the theoretical density is 9.56 (g/cm$^3$), the relative densities were 98.30%.

The leakage magnetic flux from the produced target was evaluated as in Example 1. As shown in TABLE 13 below, the average leakage magnetic flux ratio was 40.0%.

TABLE 13

| | Source Field (G) | Reference Field (G) | Leakage magnetic flux density (G) | Leakage magnetic flux ratio (%) |
|---|---|---|---|---|
| 0° | 877 | 616 | 245 | 39.8 |
| 30° | 877 | 616 | 247 | 40.1 |
| 60° | 877 | 616 | 248 | 40.3 |
| 90° | 877 | 616 | 247 | 40.1 |
| 120° | 877 | 616 | 246 | 39.9 |
| Average leakage magnetic flux ratio (%) | | | | 40.0 |

Discussion

The results of the measurement of the average leakage magnetic flux ratio performed in Examples 1 and 2 and Comparative Examples 1 to 5 are summarized in TABLE 14 below. In Examples 1 and 2 and Comparative Examples 1 and 2, the thicknesses of the targets used for the measurement of the average leakage magnetic flux ratio were 7 mm. However, in Comparative Examples 3 to 5, the thicknesses of the targets used for the measurement of the average leakage magnetic flux ratio were 6 mm. Therefore, it should be noted that the difference in thickness causes the measured average leakage magnetic flux ratios in Comparative Examples 3 to 5 to tend to be larger than those in Examples 1 and 2 and Comparative Examples 1 and 2. In addition, in each of Examples 1 and 2 and Comparative Examples 1 and 2, the overall composition of the target was 91 (73Co-11Cr-16Pt)-4SiO$_2$-2TiO$_2$-3Cr$_2$O$_3$. However, in each of Comparative Examples 3 to 5, the overall composition of the target was 91 (71Co-11Cr-18Pt)-3SiO$_2$-2TiO$_2$-4Cr$_2$O$_3$. In each of Examples 1 and 2 and Comparative Examples 1 and 2, the ratio of the amount of Co contained in the target was 66.43 mol %. However, in each of In each of Examples 1 and 2, the target includes the magnetic phase containing Co (the ferromagnetic metal element) and the plurality of non-magnetic phases (the first non-magnetic phase and the second non-magnetic phase) containing Co (the ferromagnetic metal element), the plurality of non-magnetic phases containing a different constituent element from each other or containing constituent elements at different ratios from each other, and is therefore within the scope of the present invention. In each of Examples 1 and 2, both the first non-magnetic phase and the second non-magnetic phase contain Co, and the volume fraction of the magnetic phase (Co phase) can be reduced while the ratio of the amount of Co with respect to the total amount of the target is held constant, so that the average leakage magnetic flux ratio of the target can be increased.

In Comparative Example 1, the ratio of the amount of Co contained in the Co—Pt alloy phase is large which is 50 at %. The Co—Pt alloy phase is a magnetic phase, and only the 69Co-22Cr-9Pt alloy phase is a non-magnetic phase. Therefore, the volume fraction of the magnetic phases with respect to the total volume of the target is larger than those in Examples 1 and 2, and the average leakage magnetic flux ratio is smaller by about 12% than those in Examples 1 and 2. Thus, it is conceivable that provision of a plurality of non-magnetic phases containing a ferromagnetic metal element is important in order to improve the average leakage magnetic flux ratio of the target.

In Comparative Example 2, the ratio of the amount of Co contained in the Co—Pt alloy phase is large which is 50 at %. The Co—Pt alloy phase is a magnetic phase, and only the 69Co-22Cr-9Pt alloy phase is a non-magnetic phase. In addition, the powder mixture for pressure sintering was produced in one mixing step. It was presumed that the metal powders with different compositions were connected during mixing and migration (diffusion) of the metal atoms occurred during mixing and pressure sintering. Therefore, even in the phase formed from the 69Co-22Cr-9Pt alloy powder, part of this phase could be a magnetic phase. Actually, the average leakage magnetic flux ratio of the target in Comparative Example 2 was 31.7% and smaller by about 38% than those in Examples 1 and 2 and smaller by about 29% than that in Comparative Example 1. It was presumed that part of the phase formed from the 69Co-22Cr-9Pt alloy powder was a magnetic phase. Therefore, it is conceivable that the production of the powder mixture for pressure sintering in two mixing steps as in Examples 1 and 2 is important in order to improve the average leakage magnetic flux ratio of the target.

In each of Comparative Examples 3 and 4, as in Examples 1 and 2, the target includes two non-magnetic phases, but the second non-magnetic phase is a Pt single-element phase and does not contain Co which is the ferromagnetic metal element. Therefore, it was presumed that the volume fraction of the magnetic phase with respect to the total volume of the target was not sufficiently small and the average leakage magnetic flux ratio was not sufficiently improved. The average leakage magnetic flux ratios in Comparative Examples 3 and 4 were comparable to the average leakage magnetic flux ratios in Examples 1 and 2. However, as described above, the thicknesses of the targets in Comparative Examples 3 and 4 are smaller than the thicknesses of the targets in Examples 1 and 2, and the ratios of the amounts of Co contained in the targets in Comparative Examples 3 and 4 are smaller than those in Examples 1 and 2. Therefore, if these were matched to those in Examples 1 and 2, the average leakage magnetic flux ratios in Comparative Examples 3 and 4 could be significantly smaller than the average leakage magnetic flux ratios in Examples 1 and 2.

The comparison between the average leakage magnetic flux ratios in Comparative Examples 3 and 4 shows that the average leakage magnetic flux ratio in Comparative Example 4 in which the sintering temperature is 1,000° C. is slightly larger than that in Comparative Example 3 in which the sintering temperature is 1,030° C. This result may be because the lower the sintering temperature, the less likely the diffusion of atoms to occur. Therefore, to produce a target with the amount of leakage magnetic flux during magnetron sputtering being improved, it is preferable to use a lower sintering temperature.

In Comparative Example 5, only the 71Co-11Cr-18Pt alloy phase is a metal phase. This metal phase is a magnetic phase. Therefore, it is considered that no non-magnetic metal phase is present in the target in Comparative Example 5 and the volume fraction of the magnetic phase is high. This may be the reason that the average leakage magnetic flux ratio of the target in Comparative Example 5 is lower than the average leakage magnetic flux ratios of the targets in Comparative Examples 3 and 4. The average leakage magnetic flux ratio of the target in Comparative Example 5 is 40.0%. However, if the thickness of the target and the ratio of the amount of Co were matched to those in Examples 1 and 2 and Comparative Examples 1 and 2, the value of the average leakage magnetic flux ratio could be significantly smaller than 40.0%.

INDUSTRIAL APPLICABILITY

The target according to the present invention can be suitably used as a magnetron sputtering target. The production process according to the present invention can be suitably used as a process for producing a magnetron sputtering target.

REFERENCE SIGNS LIST

10 target
12 magnetic phase
14 first non-magnetic phase
16 second non-magnetic phase
18, 22, 26, 30, 34, 48, 58, 68 oxide phase
20, 42, 52, 62, 72 Co phase
24, 46, 56, 66 69Co-22Cr-9Pt alloy phase
28, 44 5Co-95Pt alloy phase
32, 54 10Co-90Pt alloy phase
64, 74 50Co-50Pt alloy phase

The invention claimed is:
1. A magnetron sputtering target containing a ferromagnetic metal element, the magnetron sputtering target comprising:
a magnetic phase containing the ferromagnetic metal element comprising a Co—Cr alloy containing Co in an amount of 85 at % or more;
two non-magnetic phases comprising a first non-magnetic phase of a Co—Cr—Pt alloy containing Co in an amount of greater than 0 at % to not more than 73 at %, and a second non-magnetic phase of a Co—Pt alloy containing Co in an amount of greater than 0 at % to not more than 12 at %; and
an oxide phase;
wherein the magnetic phase, first non-magnetic phase, and second non-magnetic phase are dispersed from each other and separated from each other by the oxide phase so as not to come into contact with each other.
2. The magnetron sputtering target according to claim 1, wherein the oxide phase contains at least one of $SiO_2$, $TiO_2$, $Ti_2O_3$, $Ta_2O_5$, $Cr_2O_3$, $CoO$, $CO_3O_4$, $B_2O_5$, $Fe_2O_3$, $CuO$, $Y_2O_3$, $MgO$, $Al_2O_3$, $ZrO_2$, $Nb_2O_5$, $MoO_3$, $CeO_2$, $Sm_2O_3$, $Gd_2O_3$, $WO_2$, $WO_3$, $HfO_2$, and $NiO_2$.
3. The magnetron sputtering target according to claim 1, wherein the target is used to form a magnetic recording layer.

* * * * *